United States Patent
Kurosaki et al.

(10) Patent No.: US 6,876,034 B2
(45) Date of Patent: Apr. 5, 2005

(54) SEMICONDUCTOR DEVICE HAVING ACTIVE GROOVES

(75) Inventors: Toru Kurosaki, Saitama (JP); Hiroaki Shishido, Saitama (JP); Mizue Kitada, Saitama (JP); Shinji Kunori, Saitama (JP); Kosuke Ohshima, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/607,083

(22) Filed: Jun. 27, 2003

(65) Prior Publication Data

US 2004/0021195 A1 Feb. 5, 2004

(30) Foreign Application Priority Data

Jun. 28, 2002 (JP) ........................................ 2002-190017

(51) Int. Cl.[7] .............................................. H01L 29/76
(52) U.S. Cl. ....................... 257/330; 257/117; 257/127; 257/244; 257/280; 257/281; 257/284; 257/332
(58) Field of Search ................................ 257/117, 127, 257/244, 280, 281, 284, 330, 332, 334, 506, 508, 509

(56) References Cited

U.S. PATENT DOCUMENTS

| 3,335,296 A | 8/1967 | Smart |
| 3,391,287 A | 7/1968 | Kao et al. |
| 3,541,403 A | 11/1970 | Lepselter et al. |
| 4,754,310 A | 6/1988 | Coe |
| 5,081,509 A | 1/1992 | Kozaka et al. |
| 5,216,275 A | 6/1993 | Chen |
| 5,241,195 A | 8/1993 | Tu et al. |
| 5,438,215 A | 8/1995 | Tihanyi |
| 5,883,411 A | 3/1999 | Ueda et al. |
| 6,037,632 A * | 3/2000 | Omura et al. ................ 257/341 |
| 6,184,545 B1 | 2/2001 | Werner et al. |
| 6,204,097 B1 | 3/2001 | Shen et al. |
| 6,404,032 B1 | 6/2002 | Kitada et al. |
| 6,509,610 B2 * | 1/2003 | Kawahashi et al. ......... 257/330 |
| 6,573,559 B2 | 6/2003 | Kitada et al. |
| 2003/0042555 A1 | 3/2003 | Kitada et al. |
| 2003/0160262 A1 | 8/2003 | Kitada et al. |
| 2003/0203576 A1 | 10/2003 | Kitada et al. |

FOREIGN PATENT DOCUMENTS

| EP | 1 130 653 A2 | 9/2001 |
| EP | 1 139 433 A1 | 10/2001 |
| EP | 1 289 022 A2 | 3/2003 |
| EP | 1 339 105 A2 | 8/2003 |
| EP | 1 341 238 A2 | 9/2003 |
| JP | 2001-244462 A | 9/2001 |
| JP | 2001-284604 | 12/2001 |
| JP | 2003-69017 A | 3/2003 |
| JP | 2003-243671 A | 8/2003 |
| JP | 2003-258270 A | 9/2003 |

* cited by examiner

*Primary Examiner*—Minhloan Tran
*Assistant Examiner*—Tan Tran
(74) *Attorney, Agent, or Firm*—Armstrong, Kratz, Quintos, Hanson & Brooks, LLP.

(57) ABSTRACT

A semiconductor device having grooves uniformly filled with semiconductor fillers is provided. Both ends of each of narrow active grooves are connected to an inner circumferential groove surrounding the active grooves. The growth speed of semiconductor fillers on both ends of the active grooves becomes equal to that at their central portions. As a result, a semiconductor device having the active grooves filled with the semiconductor fillers at a uniform height is obtained.

12 Claims, 16 Drawing Sheets

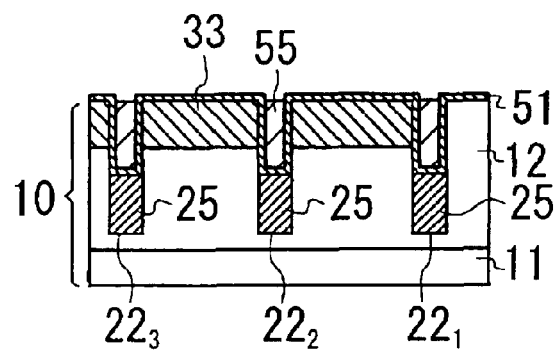
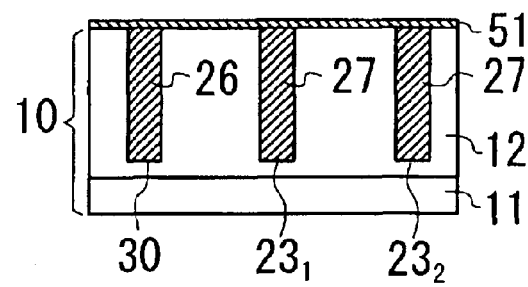
Fig. 17(a)    Fig. 17(b)
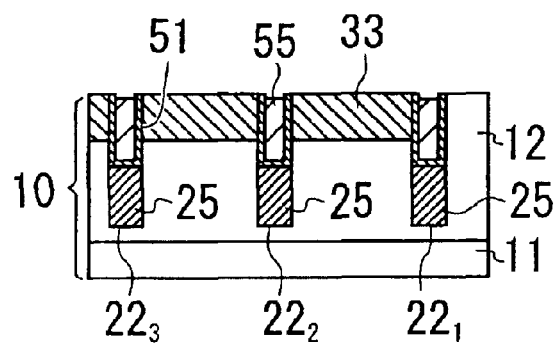
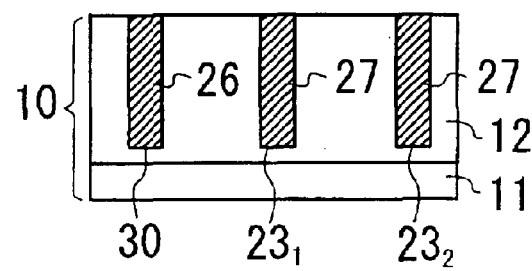
Fig. 18(a)    Fig. 18(b)
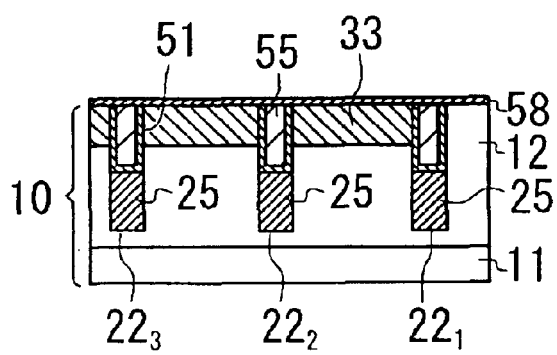
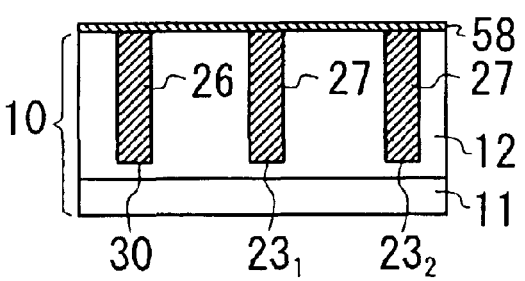
Fig. 19(a)    Fig. 19(b)

SEMICONDUCTOR DEVICE HAVING ACTIVE GROOVES

BACKGROUND OF THE INVENTION

1. Field of the Invention

The present invention relates to a semiconductor device, and particularly to a semiconductor device including grooves in which semiconductor fillers are placed.

2. Description of the Related Art

FIG. 37 is a plan view showing a diffusion structure of a conventional semiconductor device 101. This plan view corresponds to a cross section of a semiconductor substrate taken along a plane which is across a source region described below and is parallel to a surface of the semiconductor substrate.

FIG. 38 is a sectional view taken along the line J—J in FIG. 37, and FIG. 39 is a sectional view taken along the line K—K in FIG. 37. On the contrary, FIG. 37 corresponds to a sectional view taken along the line S—S in each of FIG. 38 and FIG. 39.

The semiconductor device 101 includes a semiconductor substrate 110. The semiconductor substrate 110 includes a semiconductor layer 111 and a low concentration layer 112 formed on the semiconductor layer 111. The semiconductor layer 111 is made of silicon single crystal doped with an $N^+$-type impurity at a high concentration. The low concentration layer 112 is formed of an $N^-$-type silicon epitaxial layer.

A plurality of semiconductor chip patterns described below are formed in a regular manner on the above-described semiconductor substrate 110. When the semiconductor substrate 110 is cut so as to separate individual chips from each other, the semiconductor device 101 described below can be obtained for each of the cut portions.

The semiconductor device 101 is now described. The semiconductor device 101 is a quadrangular semiconductor chip in a cut state. In its central portion, an active region, on which a trench-type power MOSFET described below is placed, is provided.

In the active region, a plurality of narrow active grooves $122_1$ to $122_4$ are placed so as to be parallel to each other.

In the periphery of the active region, a quadrangular ring-shaped inner circumferential groove 130 is provided so as to surround the active grooves $122_1$ to $122_4$, but not to be in contact with each of the active grooves $122_1$ to $122_4$. Moreover, in the periphery of the active region, a plurality of quadrangular ring-shaped guard ring grooves $123_1$ to $123_3$ are placed so as to surround the inner circumferential groove 130. The guard ring grooves $123_1$ to $123_3$ and the inner circumferential groove 130 concentrically surround the active grooves $122_1$ to $122_4$.

A P-type semiconductor filler 125 is placed in each of the grooves $122_1$ to $122_4$, 130, and $123_1$ to $123_3$.

Upper portions of the semiconductor fillers 125 in the active grooves $122_1$ to $122_4$ are removed. On the side face of the removed portion of each of the active grooves $122_1$ to $122_4$, a gate insulating film 151 is formed. The remaining parts of the semiconductor fillers 125 in the active grooves $122_1$ to $122_4$ are situated below the gate insulating film 151.

Gate electrode plugs 155 made of polysilicon are formed on the surfaces of the gate insulating films 151. In each of the active grooves $122_1$ to $122_4$, a part surrounded by the gate insulating film 151 is filled with each of the gate electrode plugs 155.

The gate electrode plugs 155 are connected to each other through a gate wiring made of a metal thin film not shown in the drawing.

A P-type base region 133 and an N-type source region 166 formed inside the base region 133 are placed between the active grooves $122_1$ to $122_4$ where at least one side of the central portion of each of the active grooves $122_1$ to $122_4$ in its longitudinal direction. In the vicinity of the surface of the semiconductor substrate 110, the source region 166 is in contact with the gate insulating film 151. At a position below the source region 166, the base region 133 is in contact with the gate insulating film 151.

A P-type ohmic region 165 having a higher concentration than that of the base region 133 is placed between the source regions 166 in the vicinity of the surface inside the base region 133.

A source electrode film 167 made of a metal thin film is formed on the surfaces of the source regions 166 and the surfaces of the ohmic regions 165 so as to be in contact therewith. A thermal oxide film 158 and a PSG film 163 are placed on each of the gate electrode plugs 155. The source electrode film 167 and the gate electrode plugs 155 are electrically insulated each other by the thermal oxide film 158 and the PSG film 163.

On the back face side of the semiconductor substrate 110, the surface of the semiconductor layer 111 is situated. On the surface of the semiconductor layer 111, a drain electrode film 170 is formed.

In the thus constituted semiconductor device 101, a positive voltage equal to or higher than a threshold voltage is applied to each of the gate electrode plugs 155 in the state where the source electrode film 167 is connected to a ground potential while a positive voltage is being applied to the drain electrode film 170. Then, an N-type inversion layer is formed in a channel region constituted by the interface between the base region 133 and the gate insulating film 151. As a result, the source region 166 and the low concentration layer 112 are connected to each other through the inversion layer, so that a current flows from the low concentration layer 112 toward the source regions 166.

In such a state, when the potential of each of the gate electrode plugs 155 is set at the same potential as that of the source electrode film 167, the inversion layer disappears so that current is not flowed. Under this condition, the transistor 101 is in a cutoff state.

When the semiconductor device 101 is in a cutoff state, a PN junction at the interface between the base region 133 and the low concentration layer 112 is reverse biased. As a result, a depletion layer is mainly expanded into the low concentration layer 112.

The semiconductor fillers 125 positioned on the bottoms of the active grooves $122_1$ to $122_4$ and the semiconductor fillers 125 positioned in the inner circumferential groove 130, and the guard ring grooves $123_1$ to $123_3$ are not in contact with each other and are respectively at a floating potential. When the reverse bias is increased so that the depletion layer reaches the semiconductor fillers 125, the depletion layer is also expanded from the semiconductor fillers 125.

When a reverse bias larger than the previously applied voltage is applied after the low concentration layer 112 between the active grooves $122_1$ to $122_4$ is entirely depleted, the depletion layer is uniformly expanded toward the semiconductor layer 111. Therefore, the semiconductor device 101 with a high withstanding voltage can be obtained.

In the semiconductor device 101 as described above, the semiconductor fillers 125 are formed by epitaxially growing semiconductor single crystal having the opposite conductivity type to that of the low concentration layer 112. However, since the semiconductor fillers 125 grow slower on both ends of the active grooves $122_1$ to $122_4$ than in their central portions, the heights of the semiconductor filler 125 are not uniform.

As a result, these uneven heights cause the short circuit between the gate electrode plug 155 and the low concentration layer 112 on both ends of the active grooves $122_1$ to $122_4$ or the current concentration on both ends of the active grooves $122_1$ to $122_4$, thereby adversely lowering a yield rate.

SUMMARY OF THE INVENTION

The present invention is devised to solve the above-described inconveniences of the related art and has an object of providing a semiconductor device with a low resistance and a high withstanding voltage.

The present invention is a semiconductor device comprising a semiconductor substrate including a low concentration layer of a first conductivity type, the semiconductor substrate having grooves formed on its surface on the low concentration layer side, wherein the grooves include a plurality of narrow active grooves and a ring-shaped inner circumferential groove surrounding the active grooves, the bottom faces of the active grooves and a bottom face of the inner circumferential groove are provided in the low concentration layer, and the both ends of each of the active grooves are connected to the inner circumferential groove.

The present invention is the semiconductor device, wherein a semiconductor filler of a second conductivity type is provided in each of the active grooves and the inner circumferential groove, and the semiconductor filler in each of the active grooves is connected to the semiconductor filler in the inner circumferential groove.

Furthermore, the present invention is the semiconductor device as above-mentioned, wherein the semiconductor substrate further has a plurality of ring-shaped guard ring grooves concentrically surrounding the inner circumferential groove.

The present invention is the semiconductor device accord as mentioned above, wherein the semiconductor filler is provided in each of the guard ring grooves.

Furthermore, the present invention is the semiconductor device, wherein the low concentration layer has a surface of a plane orientation of {100}, the inner circumferential groove is formed in a quadrangular ring shape, each of the active grooves is provided in a parallel direction to two parallel sides among four sides of the inner circumferential groove, and the {100} plane of crystal of the semiconductor substrate is exposed on a side face and a bottom face inside each of the active grooves and on a side face and a bottom face inside the inner circumferential groove.

The present invention is the semiconductor device as mentioned above further comprising the semiconductor substrate including gate grooves, each being formed by removing an upper portion of the semiconductor filler in each of the active grooves, remaining portions corresponding lower portions of the semiconductor fillers, situated at lower portions of the gate grooves, a gate insulating film provided at least on a side face of each of the gate grooves, gate electrode plugs provided in contact with the gate insulating film in the gate grooves, being insulated from the remaining portions of the semiconductor fillers, a base region of a second conductivity type provided on a surface side inside the low concentration layer at a position in contact with the gate insulating film, and a source region of a first conductivity type provided at a position on a surface side inside the base region so as to be separated from the low concentration layer and to be in contact with the gate insulating film, wherein, when a voltage is applied to the gate electrode plugs to form an inversion layer of the first conductivity type in a portion of the base region in contact with the gate insulating film, the source region and the low concentration layer are connected to each other through the inversion layer.

The present invention is the semiconductor device, wherein a height of the semiconductor filler provided in the inner circumferential groove is higher than that of the remaining portions of the semiconductor fillers in the active grooves.

Furthermore, the present invention is the semiconductor device, wherein the semiconductor substrate includes a drain layer of the first conductivity type, having a higher concentration than the low concentration layer, and a drain electrode film forming an ohmic junction with the drain layer is provided on the drain layer.

The present invention is the semiconductor device, wherein the semiconductor substrate includes a collector layer of the second conductivity type, forming a PN junction with the low concentration layer, and a collector electrode film forming an ohmic junction with the collector layer is formed on the collector layer.

The present invention is the semiconductor device, wherein a Schottky electrode film forming a Schottky junction with the low concentration layer is provided on a surface of the low concentration layer.

The present invention is the semiconductor device, wherein a Schottky electrode forming ohmic junctions with the semiconductor fillers and a Schottky junction with the low concentration layer is provided on surfaces of the semiconductor fillers provided in the active grooves and on surfaces of parts of the low concentration layer situated between the active grooves, in a region surrounded by the inner circumferential groove.

BRIEF DESCRIPTION OF THE DRAWINGS

FIG. 17(a) is a 13th sectional view for illustrating a manufacturing step of a portion corresponding to the cross section taken along the line A—A in FIG. 1, and FIG. 17(b) is a 13th sectional view for illustrating a manufacturing step of a portion corresponding to the cross section taken along the line B—B in FIG. 1;

FIG. 18(a) is a 14th sectional view for illustrating a manufacturing step of a portion corresponding to the cross section taken along the line A—A in FIG. 1, and FIG. 18(b) is a 14th sectional view for illustrating a manufacturing step of a portion corresponding to the cross section taken along the line B—B in FIG. 1;

FIG. 19(a) is a 15th sectional view for illustrating a manufacturing step of a portion corresponding to the cross section taken along the line A—A in FIG. 1, and FIG. 19(b) is a 15th sectional view for illustrating a manufacturing step of a portion corresponding to the cross section taken along the line B—B in FIG. 1;

DETAILED DESCRIPTION OF THE PREFERRED EMBODIMENTS

The inventors of the present invention consider that slow growth of the semiconductor fillers 125 on both ends of the active grooves $122_1$ to $122_4$ is due to a difference in a material gas flow for epitaxial growth between the end portions and the central portions.

Specifically, three sides of both ends of the active grooves $122_1$ to $122_4$ are surrounded by the low concentration layer 112. Therefore, it is assumed that the active grooves $122_1$ to $122_4$ and the inner circumferential groove 130 are connected to each other to bring both ends of the active grooves $122_1$ to $122_4$ into the same state as that of the central portions, resulting in uniform growth of the semiconductor fillers 125.

In the case where a semiconductor substrate including a surface having plane orientation of {100} is used, the {100} plane is exposed on the bottom faces of the grooves. Therefore, if the {100} plane is also exposed on the side faces of the grooves, it is estimated that the semiconductor fillers 125 are uniformly grown even on four corners of quadrangular ring-shaped grooves.

The present invention is devised based on the above-described knowledge; embodiments of the present invention will be described below with reference to the accompanying drawings.

Figure 1:
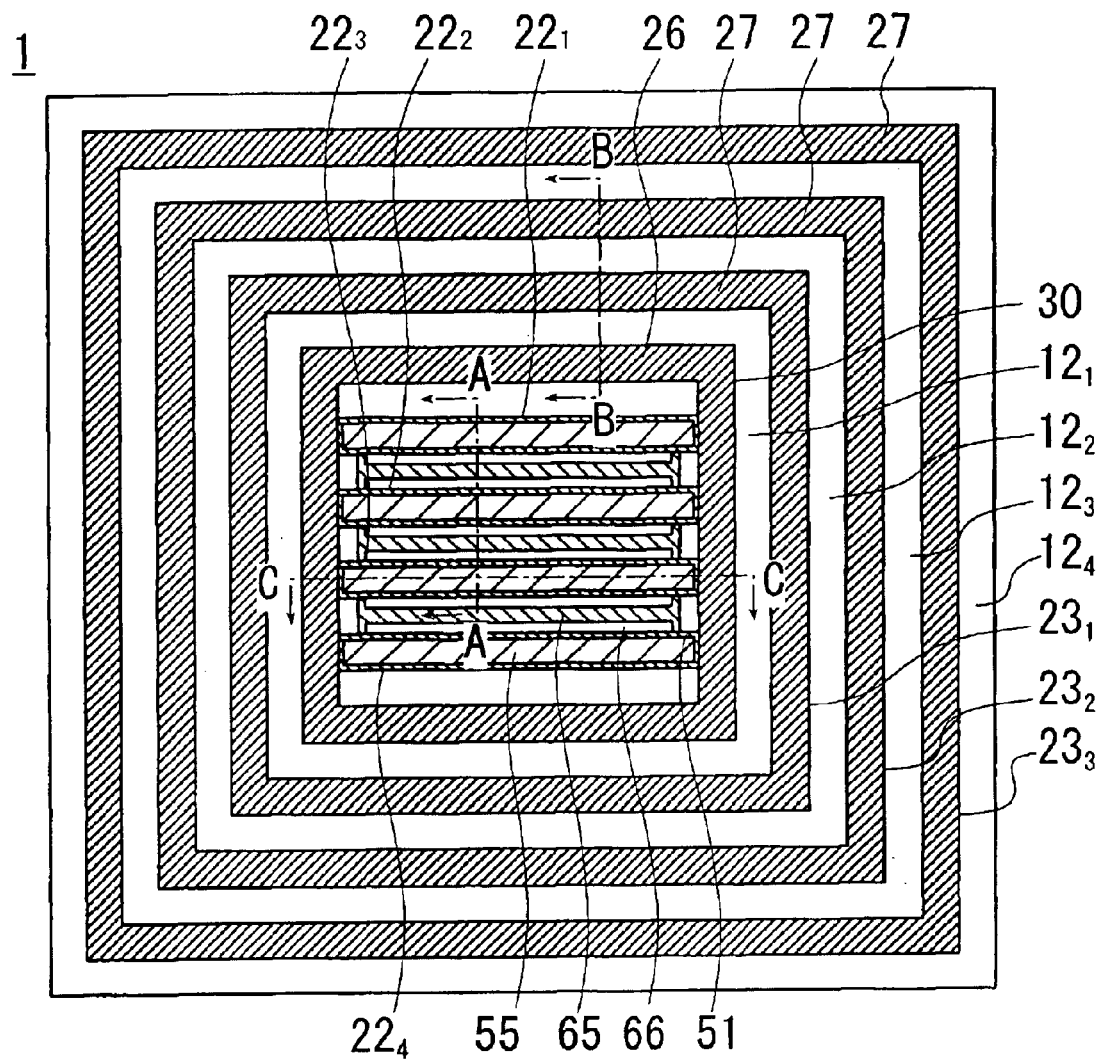
FIG. 1 is a plan view showing a MOSFET diffusion structure of an example of a semiconductor device according to the present invention.

The reference numeral 1 in FIG. 1 denotes a MOSFET type semiconductor device in one embodiment of the present invention. FIG. 1 is a sectional view showing a semiconductor substrate 10 taken along a plane that is across a source region described below and parallel to a surface of the semiconductor substrate 10.

A plurality of the semiconductor devices 1 are simultaneously formed on a single wafer. The semiconductor devices 1 are separated from each other by a dicing step to obtain quadrangular semiconductor chips. Thereafter, the thus obtained semiconductor chips through a die bonding and wire bonding step and a molding step so as to be usable.

Figure 2:
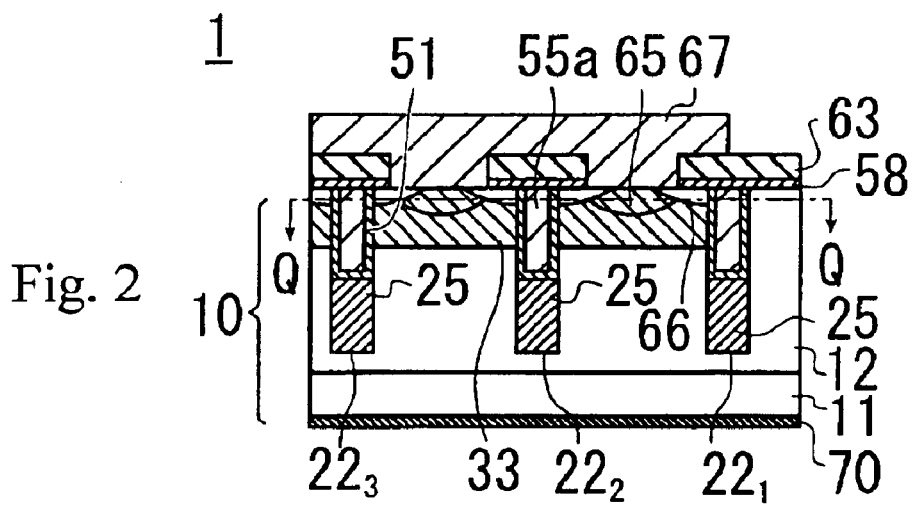
FIG. 2 is a sectional view taken along the line A—A in FIG. 1.
Figure 3:
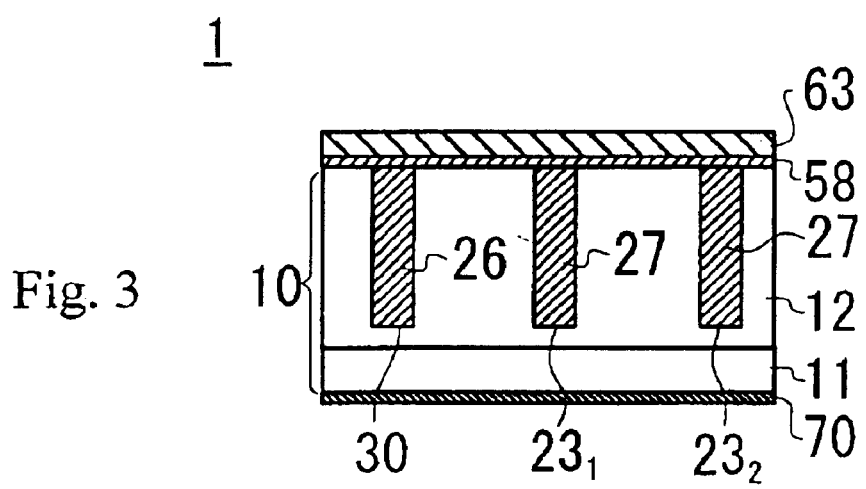
FIG. 3 is a sectional view taken along the line B—B in FIG. 1.
Figure 4:
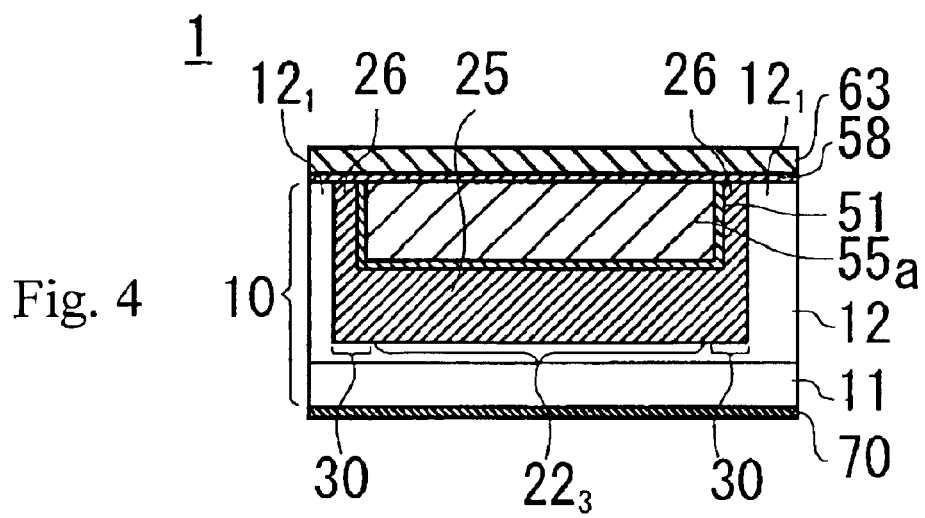
FIG. 4 is a sectional view taken along the line C—C in FIG. 1.

FIGS. 2 to 4 correspond to sectional views taken along lines A—A, B—B, and C—C in FIG. 1, respectively. On the contrary, FIG. 1 is a sectional view taken along the line Q—Q in FIG. 2.

Outside an active region, a ring-shaped inner circumferential groove 30 and a plurality of ring-shaped guard ring grooves $23_1$ to $23_3$, which are formed at a groove fabrication step described below, are provided so as to surround the active region. The guard ring grooves $23_1$ to $23_3$ are concentrically placed outside the inner circumferential groove 30.

Each of the inner circumferential groove 30 and the guard ring grooves $23_1$ to $23_3$ has an rectangular ring shape. One side of each of the guard ring grooves $23_1$ to $23_3$ is parallel to one side of the inner circumferential groove 30. At the same time, a distance between the inner circumferential groove 30 and the guard ring groove $23_1$ at the innermost circumference and the respective distances between guard ring grooves $23_1$ to $23_3$ are all equal to each other.

A plurality of narrow linear active grooves $22_1$ to $22_4$ are formed in the active region.

The active grooves $22_1$ to $22_4$ are provided so as to be parallel to each other as well as to be parallel to two parallel sides of the inner circumferential groove 30.

The plane orientation of the surface of the semiconductor substrate 10 is {100}. In addition, a direction of the plane orientation of the surface of the semiconductor substrate 10 and a direction of the grooves are aligned with each other at the groove fabrication step so that the {100} plane is exposed on the side faces of the active grooves $22_1$ to $22_4$ in their longitudinal direction.

As a result, the {100} plane is exposed on the side surfaces of the inner circumferential groove 30 and the guard ring grooves $23_1$ to $23_3$, the side faces of the active grooves $22_1$ to $22_4$, and the bottom faces of the respective grooves $23_1$ to $23_3$, $22_1$ to $22_4$, and 30.

Herein, the {100} plane includes all plane orientations expressed by the following Formula 1.

$$(1\ 0\ 0), (0\ 1\ 0), (0\ 0\ 1), (\bar{1}\ 0\ 0), (0\ \bar{1}\ 0), (0\ 0\ \bar{1}) \quad \text{Formula 1}$$

A P-type semiconductor filler 25 is provided on the bottom of each of the active grooves $22_1$ to $22_4$ by a groove filling step described below. P-type semiconductor fillers 26 and 27 are placed in the inner circumferential groove 30 and the guard ring grooves $23_1$ to $23_3$ by the same groove filling step, from the bottoms of the inner circumferential groove 30 and the guard ring grooves $23_1$ to $23_3$ so as to reach the surface of the semiconductor substrate 10.

Both ends of each of the active grooves $22_1$ to $22_4$ are in contact with the inner circumferential groove 30. Therefore, the semiconductor filler 26 in the inner circumferential groove 30 and the semiconductor fillers 25 in the active grooves $22_1$ to $22_4$ are connected to each other.

Hereinafter, a manufacturing process of the semiconductor device 1 having the above-described structure will be described.

FIGS. 5(a) and 5(b) to FIGS. 26(a) and 26(b) are views for illustrating a manufacturing process of the semiconductor device 1 according to the present invention. FIGS. 5(a) to 26(a) are sectional views showing a portion corresponding to a line A—A in FIG. 1, whereas FIGS. 5(b) to 26(b) are sectional views showing a portion corresponding to a line B—B in FIG. 1, in the order of manufacturing steps.

Figure 5A:
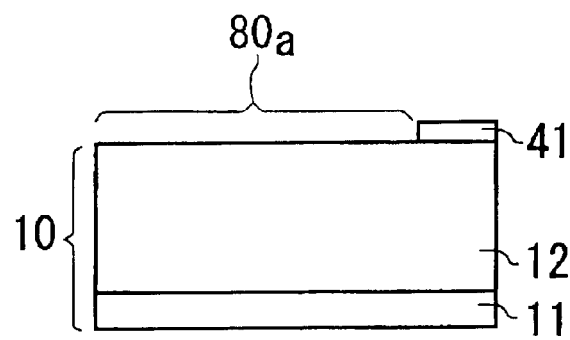
FIG. 5(a) is a first sectional view for illustrating a manufacturing step of a portion corresponding to the cross section taken along the line A—A in FIG. 1.
Figure 5B:
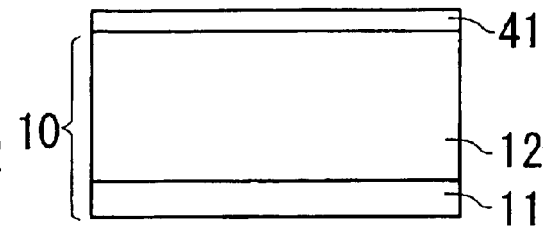
FIG. 5(b) is a first sectional view for illustrating a manufacturing step of a portion corresponding to the cross section taken along the line B—B in FIG. 1.

First, referring to FIGS. 5(a) and 5(b), the reference numeral 10 denotes a semiconductor substrate to which the following manufacturing process is applied.

In this embodiment, a first conductivity type is N-type, while a second conductivity type is P-type. The semiconductor substrate 10 includes a semiconductor layer 11 and a low concentration layer 12, each being of the first conductivity type. The semiconductor layer 11 is made of silicon single crystal. The low concentration layer 12 is formed by epitaxially growing silicon on the surface of the semiconductor layer 11.

A silicon oxide film 41 is formed on the surface of the low concentration layer 12. Next, the silicon oxide film 41 is patterned so as to form an opening 80a serving as an active region at the center of a pattern serving as a single semiconductor device 1.

A plurality of semiconductor device patterns are formed on a single semiconductor substrate 10 by processing each of the manufacturing steps described below. The above-described opening 80a has a quadrangular shape and has an edge spaced away by a predetermined distance from the interface between the pattern constituting a single semiconductor device 1 and the pattern constituting another semiconductor device. On the bottom of the opening 80a, the low concentration layer 12 is exposed.

Figure 6A:
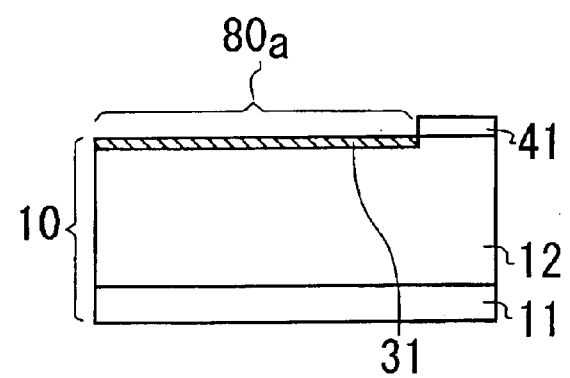
FIG. 6(a) is a second sectional view for illustrating a manufacturing step of a portion corresponding to the cross section taken along the line A—A in FIG. 1.
Figure 6B:
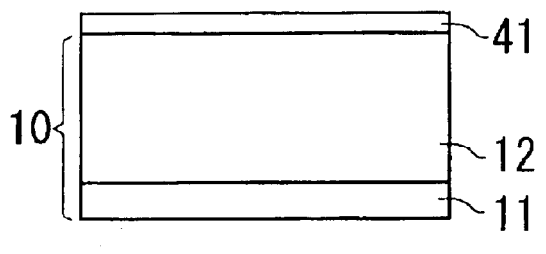
FIG. 6(b) is a second sectional view for illustrating a manufacturing step of a portion corresponding to the cross section taken along the line B—B in FIG. 1.

Next, the surface of the semiconductor substrate 10 is irradiated with an impurity of the second conductivity type such as boron. Then, the impurity of the second conductivity type is injected into the surface of the low concentration layer 12 exposed on the bottom of the opening 80a with the silicon oxide film 41 serving as a mask, as shown in FIG. 6(a). As a result, a second conductivity type injection layer 31 having the same planar shape as that of the opening 80a is formed. The second conductivity type injection layer 31 is not formed outside the active region, as shown in FIG. 6(b).

Figure 7A:
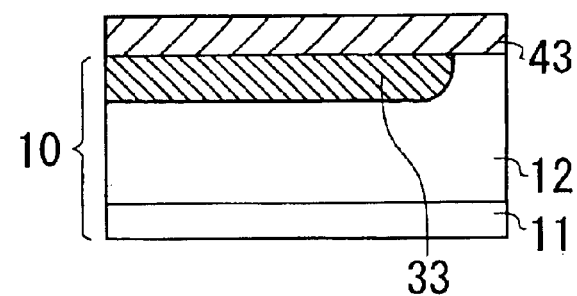
FIG. 7(a) is a third sectional view for illustrating a manufacturing step of a portion corresponding to the cross section taken along the line A—A in FIG. 1, and FIG. (b) is a third sectional view for illustrating a manufacturing step of a portion corresponding to the cross section taken along the line B—B in FIG. 1.

Next, a thermal oxidation treatment is treated to diffuse the impurity of the second conductivity type included in the second conductivity type injection layer 31 as shown in FIG. 7(a). As a result, a base region 33 formed of the impurity diffusion layer of the second conductivity type is made at the position where the low concentration layer 12 is exposed through the opening 80a. The base region 33 constitutes a part of the semiconductor substrate 10.

Figure 7B:
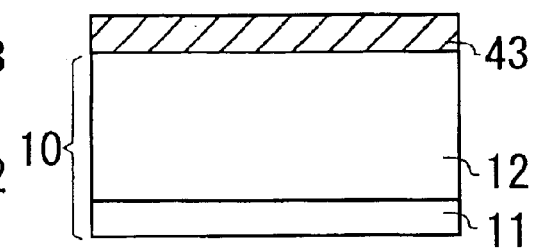

At this moment, another new silicon oxide film is formed on the surfaces of the silicon oxide film 41 and the second conductivity type injection layer 31. In FIGS. 7(a) and 7(b), the reference numeral 43 denotes an insulating film made of a silicon oxide film situated on the semiconductor substrate 10 after the thermal oxidation treatment.

Subsequently, the insulating film 43 is patterned so as to form a plurality of ring-shaped openings and a plurality of linear openings. Outside the outer circumference of the base region 33, the ring-shaped openings are formed on the insulating film 43 so as to surround the base region 33. The linear openings are formed so as to be parallel to each other across the base region 33.

Figure 8A:
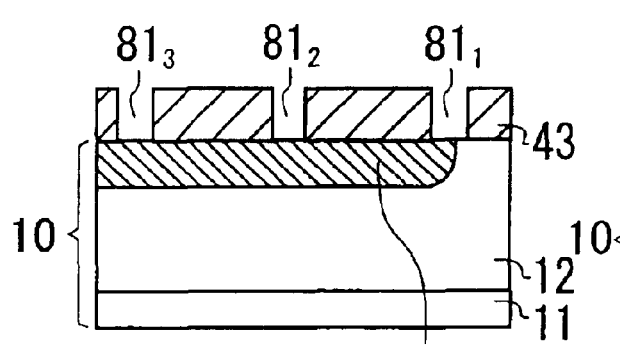
FIG. 8(a) is a 4th sectional view for illustrating a manufacturing step of a portion corresponding to the cross section taken along the line A—A in FIG. 1.
Figure 8B:
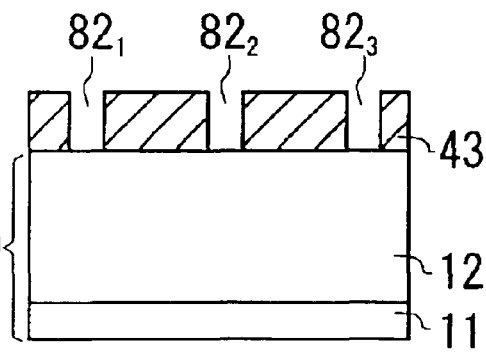
FIG. 8(b) is a 4th sectional view for illustrating a manufacturing step of a portion corresponding to the cross section taken along the line B—B in FIG. 1.

The reference numerals $82_1$ to $82_3$ in FIGS. 8(a) and 8(b) denote inner three rectangular ring-shaped openings among a plurality of the ring-shaped openings. The reference numerals $81_1$ to $81_3$ denote three adjacent linear openings among a plurality of the linear openings.

Both ends of each of the linear openings $81_1$ to $81_3$ are connected to the ring-shaped opening $82_1$ positioned at the innermost circumference among the ring-shaped openings $82_1$ to $82_3$.

The low concentration layer 12 is exposed on the bottom of each of the rectangular ring-shaped openings $82_1$ to $82_3$. On the bottom of each of the linear openings $81_1$ to $81_3$, the base region 33 of the second conductivity type and the low concentration layer 12 of the first conductivity type are exposed.

Next, the semiconductor substrate 10 is etched using the insulating film 43 as a mask. In this manner, the bottom portions of the respective openings $81_1$ to $81_3$ and $82_1$ to $82_3$ are removed to form grooves. Among the thus formed grooves, the reference numerals $22_1$ to $22_3$ of FIG. 9(a) denote three linear narrow active grooves formed below the bottom faces of the three linear openings $81_1$ to $81_3$, whereas the reference numeral 30 in FIG. 9(b) denotes an inner circumferential groove formed below the bottom face of the innermost circumferential groove $82_1$ among the ring-shaped openings $82_1$ to $82_3$.

Figure 9A:
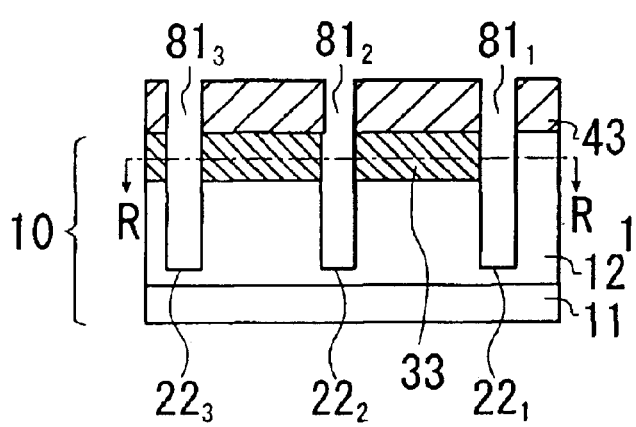
FIG. 9(a) is a 5th sectional view for illustrating a manufacturing step of a portion corresponding to the cross section taken along the line A—A in FIG. 1.
Figure 9B:
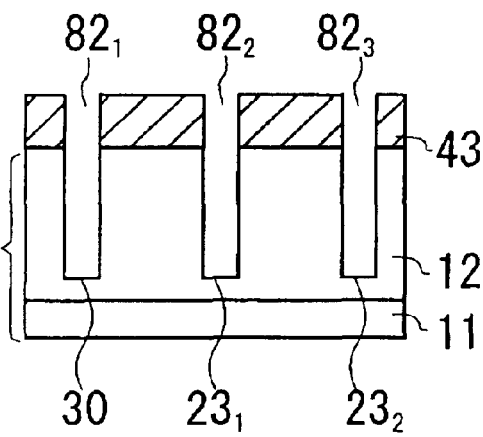
FIG. 9(b) is a 5th sectional view for illustrating a manufacturing step of a portion corresponding to the cross section taken along the line B—B in FIG. 1.

The reference numerals $23_1$ and $23_2$ in FIG. 9(b) denote two guard ring grooves formed below the bottom faces of two ring-shaped openings $82_2$ and $82_3$ outside the innermost opening $82_1$ among three ring-shaped openings $82_1$ to $82_3$.

Figure 31:
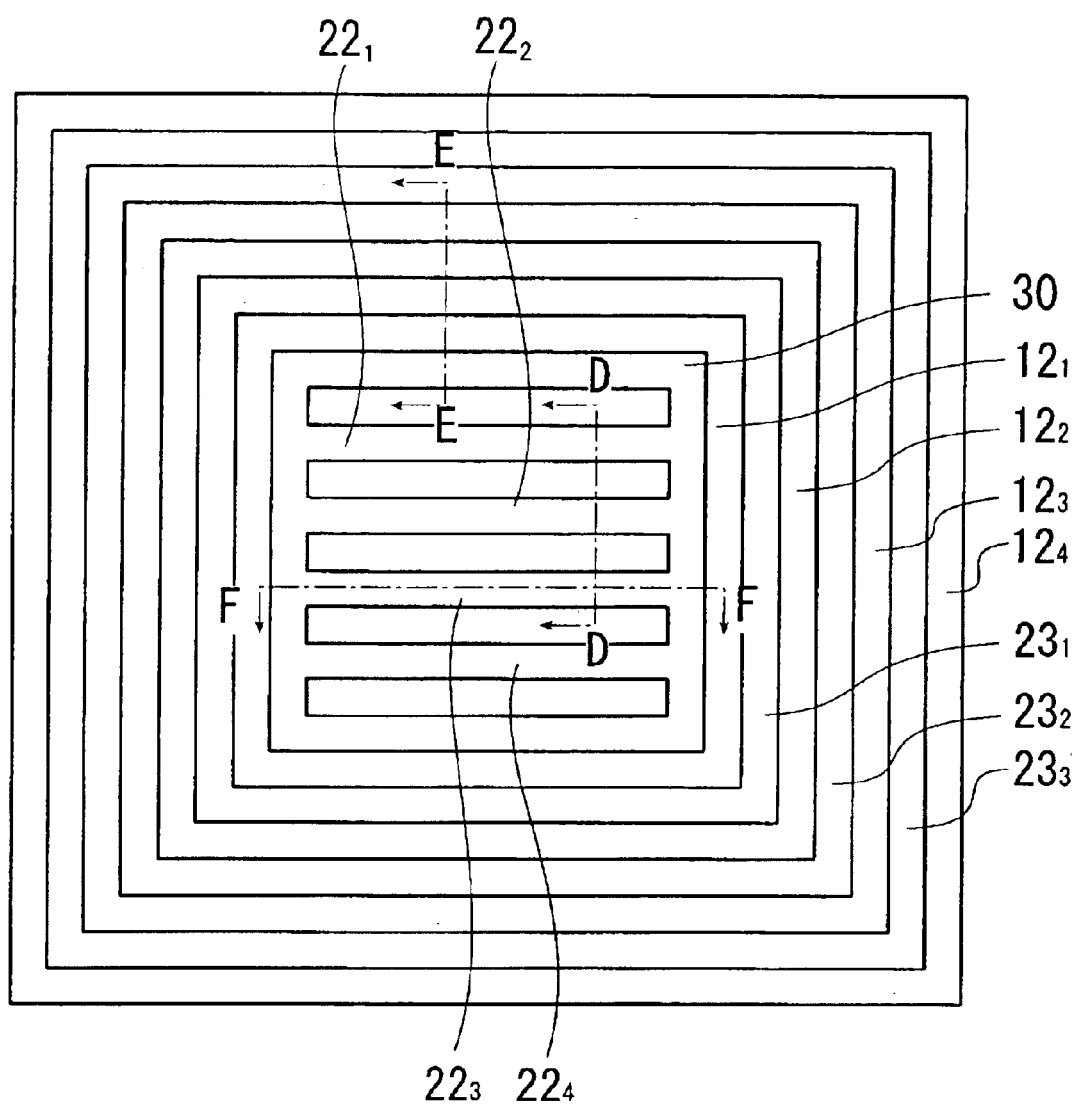
FIG. 31 is a plan view for illustrating a manufacturing step of the semiconductor device according to one embodiment of the present invention.

FIG. 31 shows a plan view of this state. A cross section taken along the line F—F of FIG. 31 is shown in FIG. 27 and FIGS. 28 to 30 described below. FIGS. 9(a) and 9(b) are views corresponding to sectional views taken along the line D—D and a line E—E in FIG. 31, respectively.

As shown in FIG. 31, in this embodiment, four active grooves and three guard ring grooves are formed, as denoted by the reference numerals $22_1$ to $22_4$ and $23_1$ to $23_3$, respectively. Both ends of all the active grooves $22_1$ to $22_4$ are connected to the inner circumferential groove 30. For the subscript of numerals of grooves in the description, however, active grooves are described as 4 and guard ring grooves are described as 3.

In the sectional views of the present invention, active grooves from the fourth active grooves $22_4$ and guard ring grooves from the third guard ring groove $23_3$ are omitted.

In the above-described etching treatment, a depth of each of the grooves $22_1$ to $22_4$, 30 and $23_1$ to $23_3$ is determined to be smaller than a thickness of the low concentration layer 12 and larger than a depth of the base region 33. As a result, the bottom portion of each of the grooves $22_1$ to $22_4$, 30, and $23_1$ to $23_3$ is situated between the interface between the semiconductor layer 11 and the low concentration layer 12 and the bottom of the base region 33.

Figure 10A:
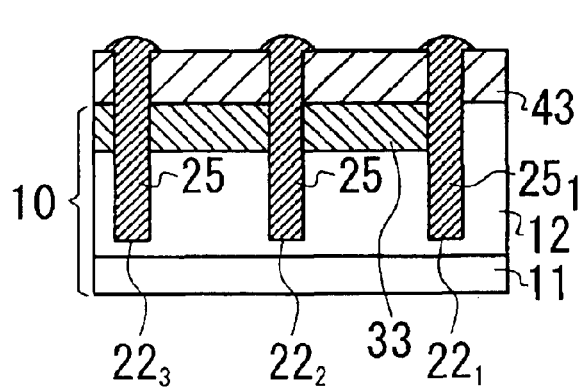
FIG. 10(a) is a 6th sectional view for illustrating a manufacturing step of a portion corresponding to the cross section taken along the line A—A in FIG. 1.
Figure 10B:
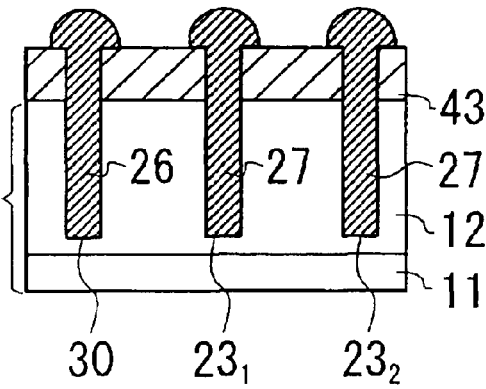
FIG. 10(b) is a 6th sectional view for illustrating a manufacturing step of a portion corresponding to the cross section taken along the line B—B in FIG. 1.
Figure 28:
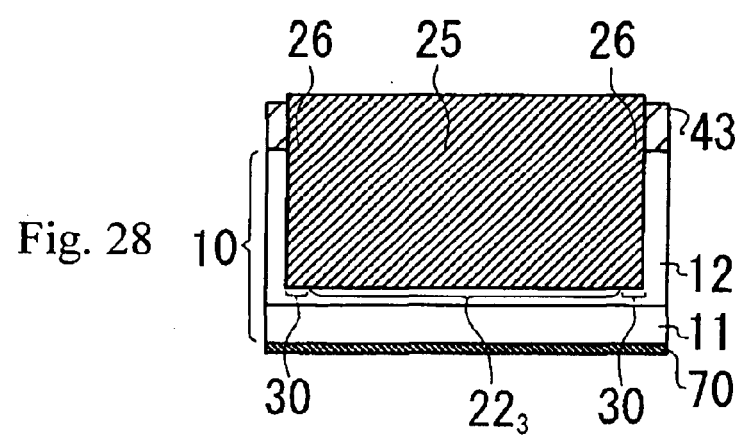
FIG. 28 is a second sectional view for illustrating a manufacturing step of a portion corresponding to the cross section taken along the line C—C in FIG. 1.

Subsequently, as shown in FIGS. 10(a), 10(b), and FIG. 28, an epitaxial layer of silicon single crystal, to which an impurity of the second conductivity type is added, is grown on the surface of each of the grooves $22_1$ to $22_4$, 30, and $23_1$ to $23_3$. As a result, each of the grooves $22_1$ to $22_4$, 30, and $23_1$ to $23_3$ is filled with a semiconductor filler of the second conductivity type made of the epitaxially grown layer.

In a conventional semiconductor device, the low concentration layer serves as a partition between both ends of the active groove and the ring-shaped groove. Accordingly, a condition of epitaxial growth differs on both ends of the active groove from that in the central portion. The speed of the epitaxial growth is actually slow on both ends of the active groove, resulting in both ends of the active groove incompletely filled with a semiconductor filler.

In the semiconductor device 1 according to the present invention, since the active grooves $22_1$ to $22_4$ and the inner circumferential groove 30 are connected, both ends of the active $22_1$ to $22_4$ and the inner circumferential groove 30 are not partitioned by the low concentration layer 12. Therefore, the epitaxial growth proceeds under the same condition on both ends and in the central portion of each of the narrow linear active grooves $22_1$ to $22_4$. As a result, the active grooves $22_1$ to $22_4$ are completely filled with semiconductor fillers throughout the entire longitudinal direction.

A wafer having the surface with the plane orientation of {100} is used as the semiconductor substrate 10. Since the {100} plane is exposed on the side faces of the inner circumferential groove 30 and the guard ring grooves $23_1$ to $23_3$, the side faces of the active grooves $22_1$ to $22_4$, and the bottom faces of the respective grooves $23_1$ to $23_3$, $22_1$ to $22_4$ and 30, the plane orientations of the surface of the semiconductor substrate 10 exposed inside the grooves are all equal to each other. Thus, single crystal of semiconductor is epitaxially grown from the bottom face and the side faces at the same growth speed to completely fill each of the grooves $30, 23_1$ to $23_3$, and $22_1$ to $22_4$. Therefore, in particular, a dent or the like is not generated on both ends of the active grooves $22_1$ to $22_4$. Therefore, the electric field is not concentrated on a dent or the like.

Figure 11A:
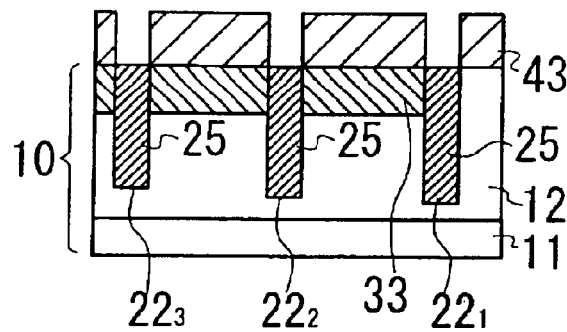
FIG. 11(a) is a 7th sectional view for illustrating a manufacturing step of a portion corresponding to the cross section taken along the line A—A in FIG. 1.
Figure 11B:
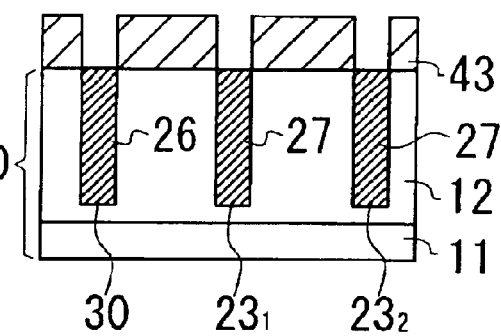
FIG. 11(b) is a 7th sectional view for illustrating a manufacturing step of a portion corresponding to the cross section taken along the line B—B in FIG. 1.

Semiconductor fillers situated in the active grooves $22_1$ to $22_4$, a semiconductor filler situated in the inner circumferential groove 30, and semiconductor fillers situated in the guard ring grooves $23_1$ to $23_3$ are denoted by the reference numerals 25, 26, and 27, respectively. Each of the semiconductor fillers 25 to 27 grows beyond the upper end of each of the grooves $22_1$ to $22_4$, 30, and $23_1$ to $23_3$ to reach at least inside the openings $81_1$ to $81_3$ and $82_1$ to $82_3$ on the insulating film 43. The upper portions of the semiconductor fillers 25 to 27 exceeding the surface of the semiconductor substrate 10 are removed as shown in FIGS. 11(a) and 11(b).

Figure 12A:
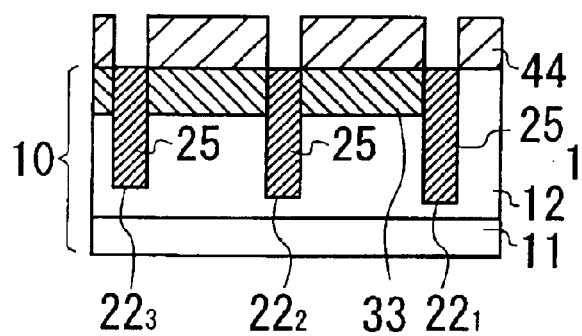
FIG. 12(a) is a 8th sectional view for illustrating a manufacturing step of a portion corresponding to the cross section taken along the line A—A in FIG. 1.
Figure 12B:
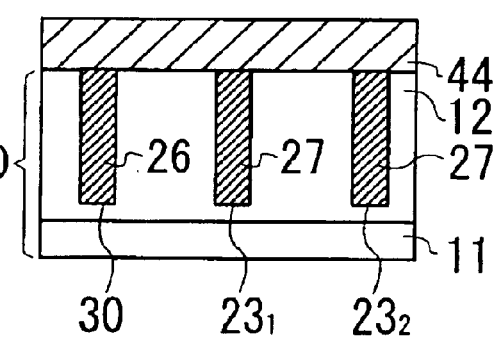
FIG. 12(b) is a 8th sectional view for illustrating a manufacturing step of a portion corresponding to the cross section taken along the line B—B in FIG. 1.

Next, after the insulating film 43 is entirely removed, another new insulating film 44 is formed. Thereafter, the insulating film 44 is patterned so that only the upper portions of the semiconductor fillers 25 filling the active grooves $22_1$ to $22_4$ are exposed as shown in FIG. 12(a) while covering the upper portions of the inner circumferential groove 30 and the guard ring grooves $23_1$ to $23_3$ with the insulating film 44 as shown in FIG. 12(b).

In this state, the upper portions of the semiconductor fillers 25 in the active groove $22_1$ to $22_4$ are removed by etching so as to leave the remaining portions of the semiconductor fillers 25 on the bottom faces of the active grooves $22_1$ to $22_4$.

The amount of the upper portion of the semiconductor filler 25 to be removed can be adjusted by varying the amount of time of etching. By appropriately setting the amount of treatment time, the upper ends of the remaining portions of the semiconductor fillers 25 are situated lower than the bottom of the base region 33 and the base region 33 is exposed on the upper portions of the side faces of the active grooves $22_1$ to $22_4$. In this manner, the low concentration layer 12 is exposed at the position between the bottom face of the base region 33 and the upper ends of the remaining portions of the semiconductor fillers 25.

Moreover, by appropriately setting the etching condition, heights of the remaining portions of the semiconductor fillers 25 are determined to be constant.

Figure 13A:
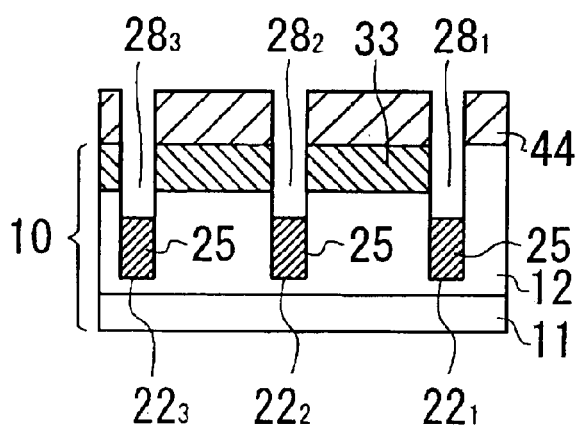
FIG. 13(a) is a 9th sectional view for illustrating a manufacturing step of a portion corresponding to the cross section taken along the line A—A in FIG. 1.
Figure 13B:
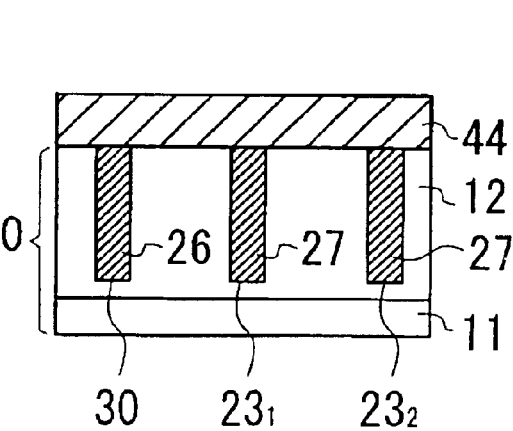
FIG. 13(b) is a 9th sectional view for illustrating a manufacturing step of a portion corresponding to the cross section taken along the line B—B in FIG. 1.

FIG. 13(a) shows a state of the active grooves $22_1$ to $22_4$ after being etched, whereas FIG. 13(b) shows a state of the inner circumferential groove 30 and the guard ring grooves $23_1$ to $23_3$.

The reference numeral $28_1$ to $28_3$ denote gate grooves, each being made of a portion where the semiconductor filler 25 is removed.

Figure 29:
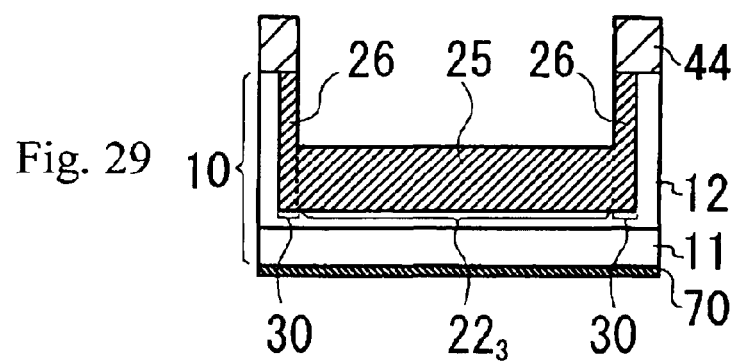
FIG. 29 is a third sectional view for illustrating a manufacturing step of a portion corresponding to the cross section taken along the line C—C in FIG. 1.
Figure 30:
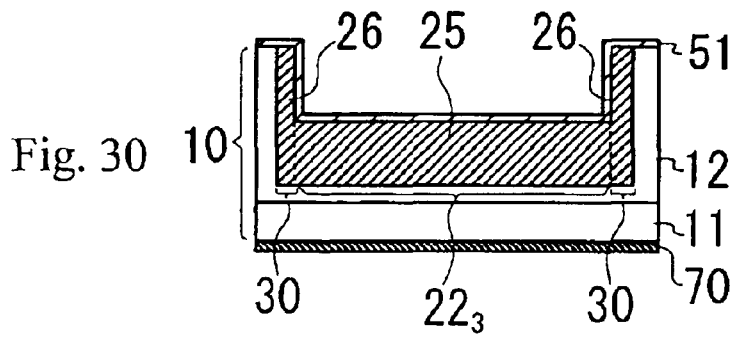
FIG. 30 is a 4th sectional view for illustrating a manufacturing step of a portion corresponding to the cross section taken along the line C—C in FIG. 1.

FIG. 29 shows a sectional view corresponding to a position taken along the line C—C in FIG. 1. Since the upper portions of the semiconductor fillers 25 of the active grooves $22_1$ to $22_4$ are removed whereas the bottom portions of the semiconductor fillers 25 remain, the semiconductor fillers 25 are connected to the semiconductor filler 26 in the inner circumferential groove 30.

As the upper portions of the guard ring grooves $23_1$ to $23_3$ are covered with the insulating film 44, the semiconductor fillers 27 positioned at the upper parts of the guard ring grooves $23_1$ to $23_3$ are left unetched.

Moreover, since the upper portion of the inner circumferential groove 30 is also covered with the insulating film 44, the semiconductor filler 26 situated at the upper portion of the inner circumferential groove 30 is left unetched.

In this state, the semiconductor substrate 10 is exposed on the side faces of parts of the active grooves $22_1$ to $22_4$ where the semiconductor fillers 25 are etched away.

At this point, since the semiconductor fillers 25 uniformly fill the active grooves $22_1$ to $22_4$ without generating any dent as described above, the semiconductor fillers 25 after the removal of their upper portions through etching have flat upper ends, without any dent or the like.

Figures 14A, 14B:
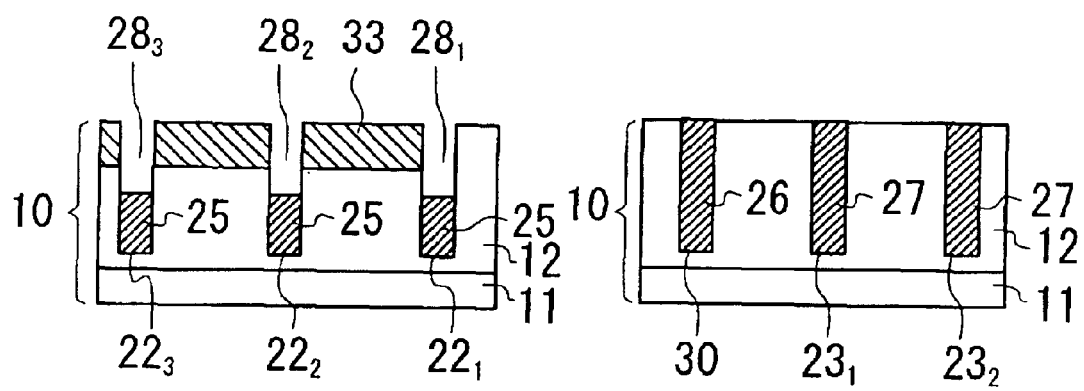
FIG. 14(a) is a 10th sectional view for illustrating a manufacturing step of a portion corresponding to the cross section taken along the line A—A in FIG. 1.
FIG. 14(b) is a 10th sectional view for illustrating a manufacturing step of a portion corresponding to the cross section taken along the line B—B in FIG. 1.
Figures 15A, 15B:
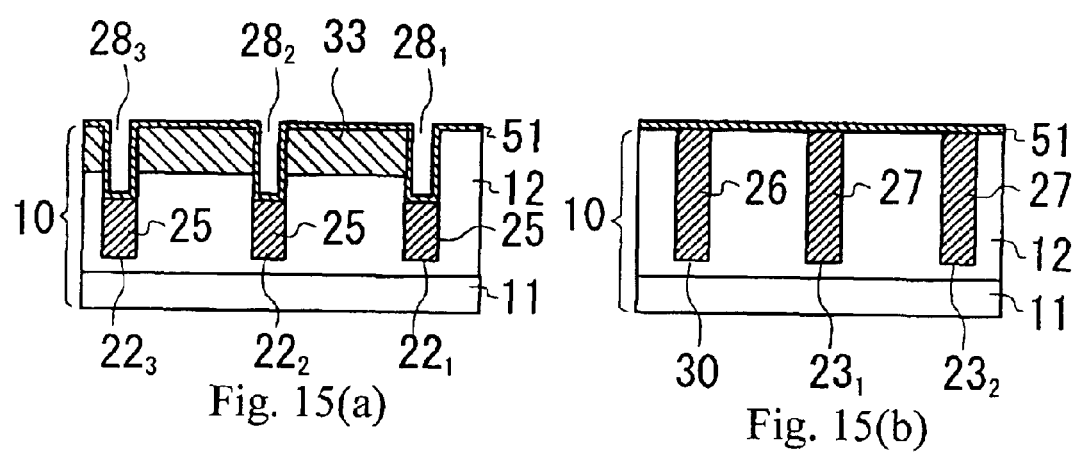
FIG. 15(a) is a 11th sectional view for illustrating a manufacturing step of a portion corresponding to the cross section taken along the line A—A in FIG. 1.
FIG. 15(b) is a 11th sectional view for illustrating a manufacturing step of a portion corresponding to the cross section taken along the line B—B in FIG. 1.

Next, as shown in FIGS. 14(a) and 14(b), when a thermal oxidation treatment is processed after removal of the entire insulating film 44. The exposed faces of the base region 33 and the low concentration layer 12, which are exposed on the inner side faces of the gate grooves $28_1$ to $28_4$ and the upper ends of the remaining portions of the semiconductor fillers 25 which are exposed on the bottom faces, are oxidized to form a gate insulating film 51 in the gate grooves $28_1$ to $28_4$ as shown in FIGS. 15(a) and 15(b). At this moment, the gate insulating film 51 is also formed on the surfaces of the base region 33 and the low concentration layer 12, which are exposed on the surface of the semiconductor substrate 10.

Since the gate insulating film 51 is thin, the parts of the active grooves $22_1$ to $22_4$, which are situated above the semiconductor fillers 25, are not filled with the gate insulating film 51, leaving a space with the bottom face and the periphery surrounded by the gate insulating film 51.

Figures 16A, 16B:
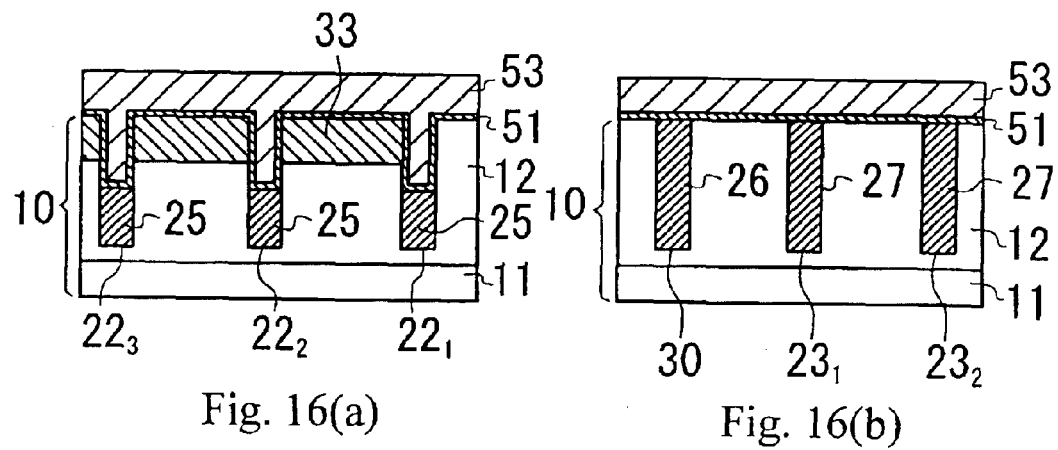
FIG. 16(a) is a 12th sectional view for illustrating a manufacturing step of a portion corresponding to the cross section taken along the line A—A in FIG. 1.
FIG. 16(b) is a 12th sectional view for illustrating a manufacturing step of a portion corresponding to the cross section taken along the line B—B in FIG. 1.
Figure 20A:
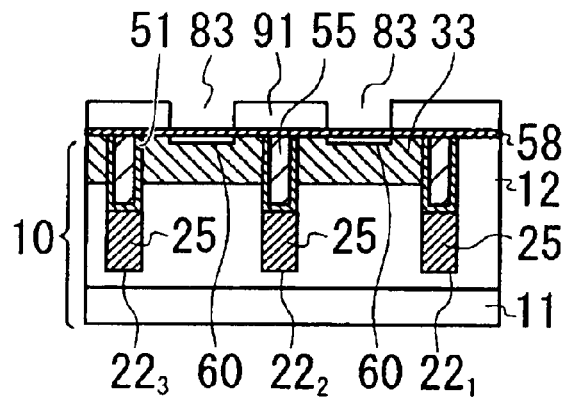
FIG. 20(a) is a 16th sectional view for illustrating a manufacturing step of a portion corresponding to the cross section taken along the line A—A in FIG. 1.
Figure 20B:
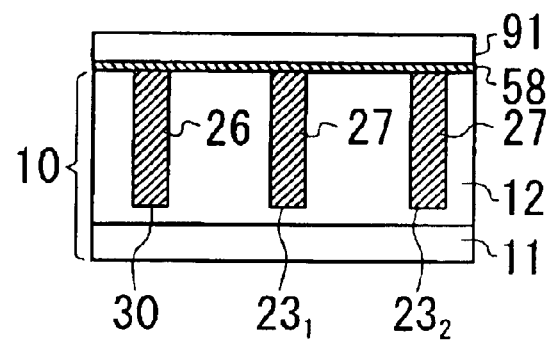
FIG. 20(b) is a 16th sectional view for illustrating a manufacturing step of a portion corresponding to the cross section taken along the line B—B in FIG. 1.

Next, polysilicon film is deposited on the surface of the gate insulating film 51. Then, as shown in FIGS. 16(a) and 16(b), a space in each of the gate groove $28_1$ to $28_4$, which is surrounded by the gate insulating film 51, is filled with a polysilicon thin film 53.

Next, the polysilicon thin film 53 situated on the gate insulating film 51 formed on the surface of the semiconductor substrate 10 is etched away by an etching step of polysilicon so as to leave the polysilicon thin film 53 in the gate grooves $28_1$ to $28_4$ as shown in FIGS. 17(a) and 17(b). As a result, gate electrode plugs 55 are formed of the polysilicon thin film 53 remaining in the gate grooves $28_1$ to $28_4$.

Subsequently, by an etching step of the oxide film, the gate insulating film 51 overlying the surface of the semiconductor substrate 10 is removed as shown in FIGS. 18(a) and 18(b). The gate insulating film 51 in each of the gate grooves $28_1$ to $28_4$ is left unetched.

Next, when the semiconductor substrate 10 is subjected to a thermal oxidation treatment, an underlayer oxide film 58 made of a thermal oxide film is formed on the surface of the semiconductor substrate 10 and the surfaces of the gate electrode plugs 55, as shown in FIGS. 19(a) and 19(b).

Subsequently, a patterned resist film is formed on the underlayer oxide film 58. The reference numeral 91 in FIGS. 20(a) and 20(b) denotes the resist film. The resist film 91 has narrow openings 83 between the active grooves $22_1$ to $22_4$ so as to be parallel to the active grooves $22_1$ to $22_4$.

These openings 83 are positioned parallel to the active grooves $22_1$ to $22_4$ so as to be at a constant distance therefrom.

The base region 33 is positioned so as to be in contact with the side faces of each of the active grooves $22_1$ to $22_4$ in a portion other than both ends of each of the active grooves $22_1$ to $22_4$, that is, between the central portions of the active grooves $22_1$ to $22_4$. Therefore, the base region 33 is positioned below the openings 83.

On the underlayer oxide film 58, portions between the active grooves $22_1$ and $22_4$, each being adjacent to the inner circumferential groove 30, and the inner circumferential groove 30, a portion between the inner circumferential groove 30 and the guard ring groove $23_1$ at the innermost circumference, and portions between the respective guard ring grooves $23_1$ to $23_3$ are covered with the resist film 91.

When the resist film 91 is irradiated with boron from above, boron is injected into the vicinity of the surface inside the base region 33, which is situated on the bottoms of the openings 83. As a result, P$^+$-type high concentration injection regions are formed. The reference numeral 60 in FIGS. 20(a) and 20(b) denotes the P$^+$-type high concentration injection regions.

Each of the P$^+$-type high concentration injection regions 60, which is formed below the bottom face of each of the narrow openings 83, has the same planar shape as that of the narrow opening 83. Therefore, each of the P$^+$-type high concentration injection regions 60 is positioned in each of the spaces between the active grooves $22_1$ to $22_4$ so as to be parallel to the active grooves $22_1$ to $22_4$ at a constant distance therefrom. At the position between each of the P$^+$-type high concentration injection regions 60 and each of the active grooves $22_1$ to $22_4$, the surface of the base region 33 is situated below the underlayer oxide film 58.

Next, after removal of the resist film 91, a resist film 92 which is patterned into another shape is formed. This resist film 92 has openings 86, each being provided at the position between each of the P$^+$-type high concentration injection regions 60 and each of the active grooves $22_1$ to $22_4$. The parts above the P$^+$-type high concentration injection regions 60 and the parts above the respective grooves $23_1$ to $23_3$, $22_1$ to $22_4$, and 30 are covered with the resist film 92.

Figure 21A:
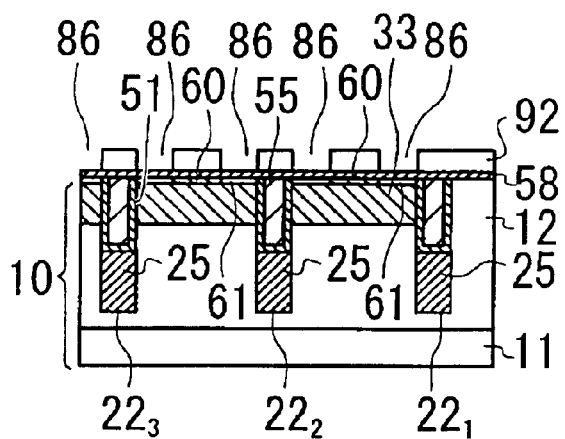
FIG. 21(a) is a 17th sectional view for illustrating a manufacturing step of a portion corresponding to the cross section taken along the line A—A in FIG. 1.
Figure 21B:
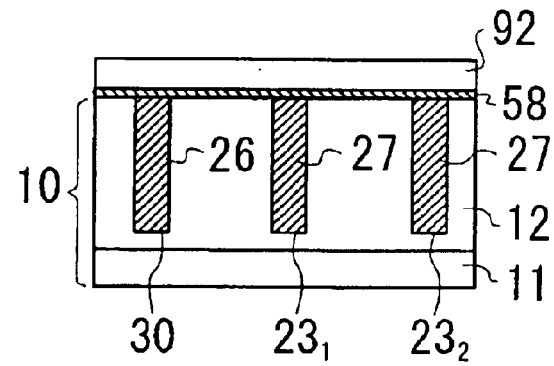
FIG. 21(b) is a 17th sectional view for illustrating a manufacturing step of a portion corresponding to the cross section taken along the line B—B in FIG. 1.

When the substrate 10 is irradiated with ions of an impurity of the first conductivity type such as phosphorous in this state, N$^+$-type injection regions 61 are formed in the vicinity of the surface inside the base region 33 through the underlayer oxide film 58 which is exposed on the bottom faces of the openings 86 as shown in FIGS. 21(a) and 21(b). Similarly to the P$^+$-type high concentration injection regions 60, each of the N$^+$-type injection regions 61 has an narrow shape. The N$^+$-type injection regions 61 are provided on both sides of the P$^+$-type high concentration injection regions 60. Each of the N$^+$-type injection regions 61 has one of two sides in a longitudinal direction being in contact with the P$^+$-type high concentration injection region 60 and the other side being in contact with the gate insulating film 51 in the active grooves $22_1$ to $22_4$.

Figure 22A:
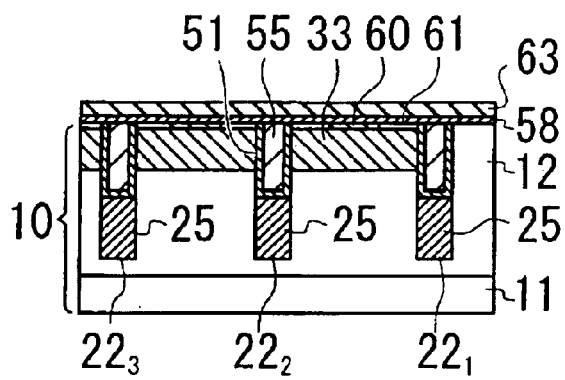
FIG. 22(a) is a 18th sectional view for illustrating a manufacturing step of a portion corresponding to the cross section taken along the line A—A in FIG. 1.
Figure 22B:
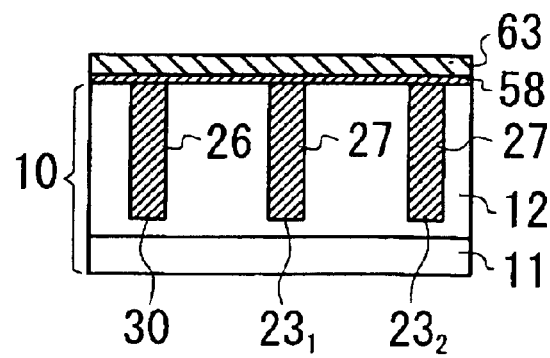
FIG. 22(b) is a 18th sectional view for illustrating a manufacturing step of a portion corresponding to the cross section taken along the line B—B in FIG. 1.
Figure 23A:
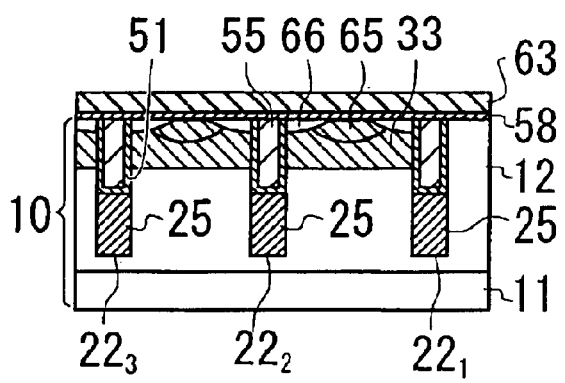
FIG. 23(a) is a 19th sectional view for illustrating a manufacturing step of a portion corresponding to the cross section taken along the line A—A in FIG. 1.
Figure 23B:
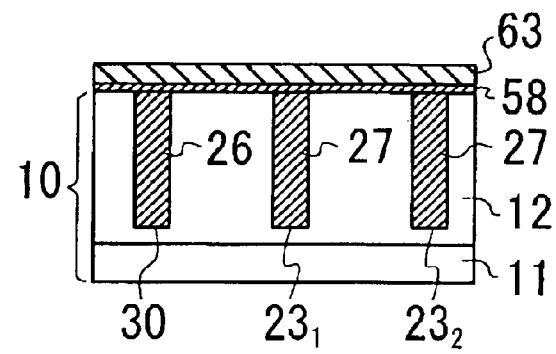
FIG. 23(b) is a 19th sectional view for illustrating a manufacturing step of a portion corresponding to the cross section taken along the line B—B in FIG. 1.

Next, after removal of the resist film 92, a PSG film 63 is formed on the surface of the underlayer oxide film 58 as shown in FIGS. 22(a) and 22(b). Thereafter, a thermal treatment is treated so as to diffuse the impurities in the P$^+$ type high concentration injection regions 60 and the N$^-$ type injection regions 61 to a depth shallower than the base region 33. As a result, as shown in FIGS. 23(a) and 23(b), ohmic regions 65 of second conductivity type (P$^+$-type) having a higher concentration than that of the base region 33 and source regions 66 of first conductivity type having a higher concentration than that of the low concentration layer 12 are formed to have predetermined depths, respectively.

The ohmic regions 65 of second conductivity type and the source regions 66 of first conductivity type are shallower than the base region 33 and situated inside the base region 33. Below the underlayer oxide film 58 at each position between the active grooves $22_1$ to $22_4$, the surface of the ohmic region 65 of second conductivity type is situated at the center and the surface of the source regions 66 of first conductivity type are situated on both sides of the ohmic region 65.

Figure 24A:
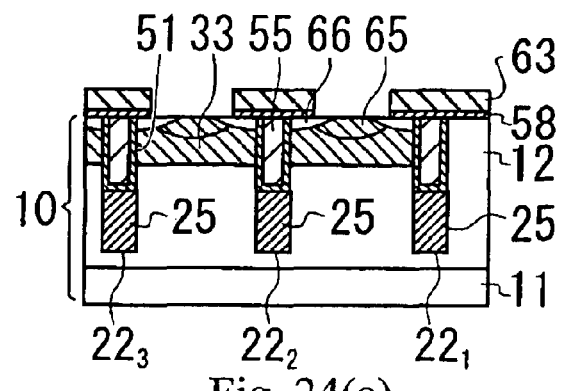
FIG. 24(a) is a 20th sectional view for illustrating a manufacturing step of a portion corresponding to the cross section taken along the line A—A in FIG. 1.
Figure 24B:
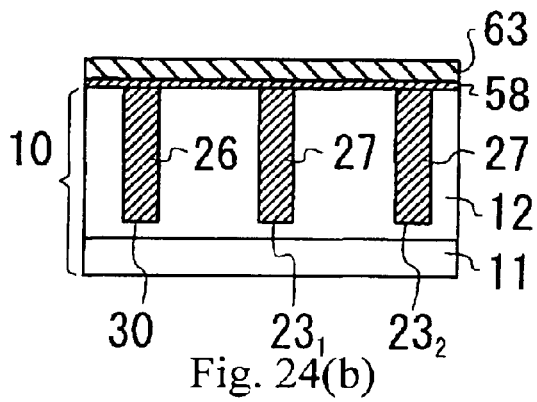
FIG. 24(b) is a 20th sectional view for illustrating a manufacturing step of a portion corresponding to the cross section taken along the line B—B in FIG. 1.

Subsequently, as shown in FIGS. 24(a) and 24(b), the PSG film 63 and the underlayer oxide film 58 are patterned together at a time so as to expose the source regions 66 and the ohmic regions 65. At this moment, the surface of each of the gate electrode plugs 55 is partially exposed at a position not shown in the drawing.

Figure 25A:
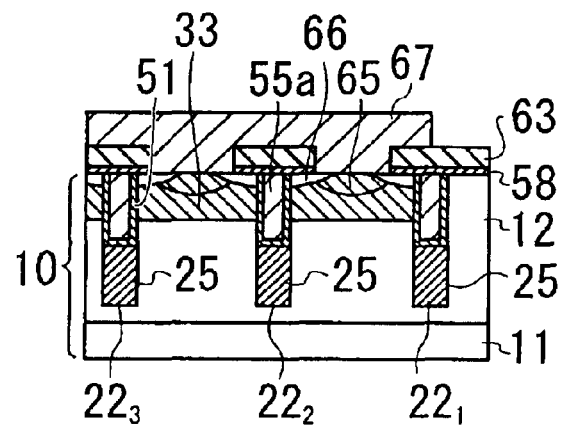
FIG. 25(a) is a 21st sectional view for illustrating a manufacturing step of a portion corresponding to the cross section taken along the line A—A in FIG. 1.
Figure 25B:
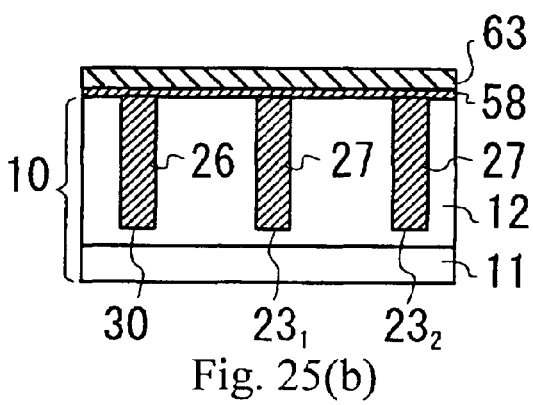
FIG. 25(b) is a 21st sectional view for illustrating a manufacturing step of a portion corresponding to the cross section taken along the line B—B in FIG. 1.

Next, after a metal film such as an aluminum film is grown on the entire surface of the semiconductor substrate 10, the metal film is patterned. As a result, as shown in FIGS. 25(a) and 25(b), a source electrode film 67, which is in contact with both the surfaces of the source regions 66 and the surfaces of the ohmic regions 65, is formed. The source regions 66 and the ohmic regions 65 are short-circuited by the source electrode film 67.

A gate wiring is formed of the same metal film that serves as the source electrode film 67, by patterning for forming the source electrode film 67. The gate wiring is separated and insulated from the source electrode film 67 and is in contact with the gate electrode plugs 55.

Figure 26A:
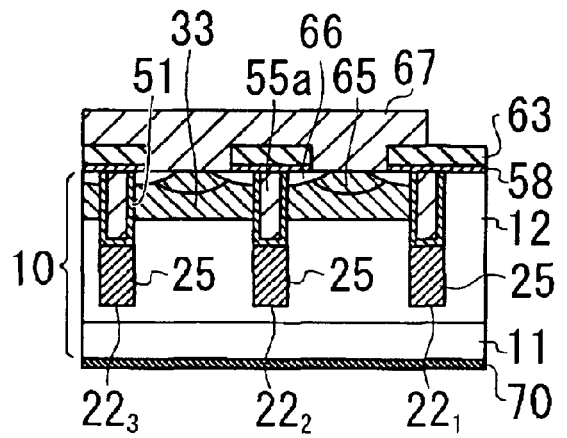
FIG. 26(a) is a 22nd sectional view for illustrating a manufacturing step of a portion corresponding to the cross section taken along the line A—A in FIG. 1.
Figure 26B:
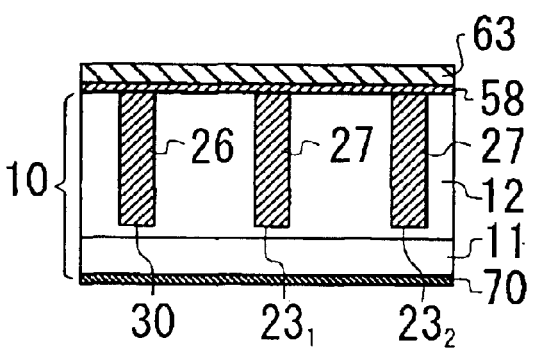
FIG. 26(b) is a 22nd sectional view for illustrating a manufacturing step of a portion corresponding to the cross section taken along the line B—B in FIG. 1.
Figure 27:
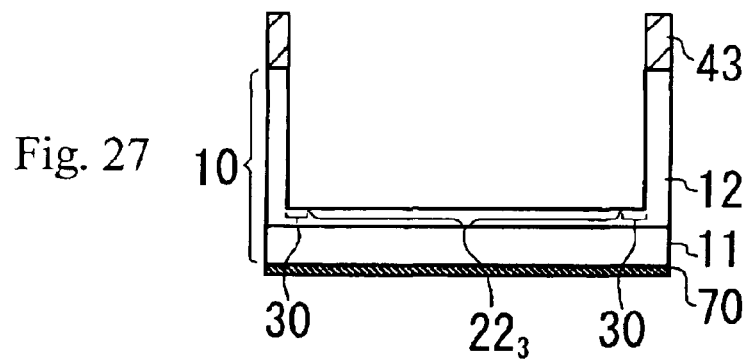
FIG. 27 is a first sectional view for illustrating a manufacturing step of a portion corresponding to the cross section taken along the line C—C in FIG. 1.

Next, a metal film made of chromium or the like is formed on the surface of the semiconductor substrate 10 which is opposite to the face where the source electrode film 67 is formed, thereby forming a drain electrode film 70 as shown in FIGS. 26(a) and 26(b). Through the above-described manufacturing steps, the semiconductor substrate 1 according to one embodiment of the present invention in a state as shown in FIGS. 1, 2, and FIG. 3 is obtained.

From this state, a plurality of the semiconductor devices 1 are separated from each other through a protection film fabrication step and the dicing step as described above. Then, through assembly steps such as a die bonding and wire bonding step and a molding step, a semiconductor device, which is sealed within a plastic package, is obtained.

In the semiconductor device 1 as described above, a positive voltage equal to or higher than a threshold voltage is applied to the gate electrode plugs 55 in the state where a positive potential is applied to the drain electrode film 70 while the source electrode film 67 is being connected to a ground potential. Then, an inversion layer of the first conductivity type is formed in a channel region (at the interface between the base region 33 and the gate insulating film 51). As a result, the source regions 66 and the low concentration layer 12 are connected to each other through the inversion layer, so that a current flows from the drain electrode film 70 toward the source electrode film 67 through the low concentration layer 12, the inversion layer, and the source regions 66. This state is referred to as a conductive state.

When the potential of each of the gate electrode plugs 55 is set at the same potential as the source electrode film 67 in this conductive state, the inversion layer disappears so that a current is not passed. Under such a condition, the semiconductor device 1 is in a cutoff state.

In the case where the semiconductor device 1 is in a cutoff state and PN junctions constituted by the interfaces between the base regions 33 and the low concentration layer 12 are reverse biased, a depletion layer is expanded into the base region 33 of the second conductivity type and the low concentration layer 12 of the first conductivity type. Since the base region 33 has a higher concentration than the low concentration layer 12, the depletion layer is expanded mainly into the low concentration layer 12 to reach the semiconductor fillers 25 and 26 in the active grooves $22_1$ to $22_4$ and the inner circumferential groove 30.

In this embodiment, although the semiconductor fillers 25 and 26 situated in the active grooves $22_1$ to $22_4$ and the inner circumferential groove 30 are connected to each other, the semiconductor fillers 25 and 26 are connected neither to the gate electrode plugs 55 nor to the source electrode film 67, resulting in being at a floating potential.

When the depletion layer expanded from the PN junctions reaches any one of the semiconductor fillers 25 and 26, the potential of the semiconductor fillers 25 and 26 is stabilized, so that the depletion layer is also expanded from these semiconductor fillers 25 and 26. When the applied voltage is further increased, the depletion layer reaches the guard ring groove $23_1$ situated at the innermost circumference of a plurality of the guard ring grooves $23_1$ to $23_3$.

The semiconductor fillers 27 situated in the respective guard ring grooves $23_1$ to $23_3$ are insulated from each other so as to be at a floating potential. When the depletion layer reaches the semiconductor fillers 27, the potential is stabilized, so that the depletion layer is also expanded from the semiconductor fillers 27 in the respective guard ring grooves $23_1$ to $23_3$. Thus, the depletion layer sequentially reaches from the guard ring groove $23_1$ at the innermost circumference to the outer guard ring grooves $23_2$ and $23_3$, further being expanded outside the outermost guard ring groove $23_3$.

Since the grooves $23_1$ to $23_3$, 30, and $22_1$ to $22_4$ are uniformly filled with the semiconductor fillers 25 to 27 so that, for example, no dent or the like is present on both ends of the semiconductor filler 25 in the active grooves $22_1$ to $22_4$, the electric field is not concentrated, resulting in increased ruggedness of an element against breakdown.

Although the case where the first conductivity type is N-type and the second conductivity type is P-type has been described above, a semiconductor device, in which the first conductivity type is P-type and the second conductivity type is N-type, is also included in the present invention in the above-described embodiment and embodiments described below.

Moreover, although the MOSFET has been described in the above-described embodiment, a semiconductor device according to the present invention is not limited thereto; for example, an IGBT (Insulated gate bipolar transistor) and a diode are also included in the semiconductor devices according to the present invention.

Figures 35A, 35B:
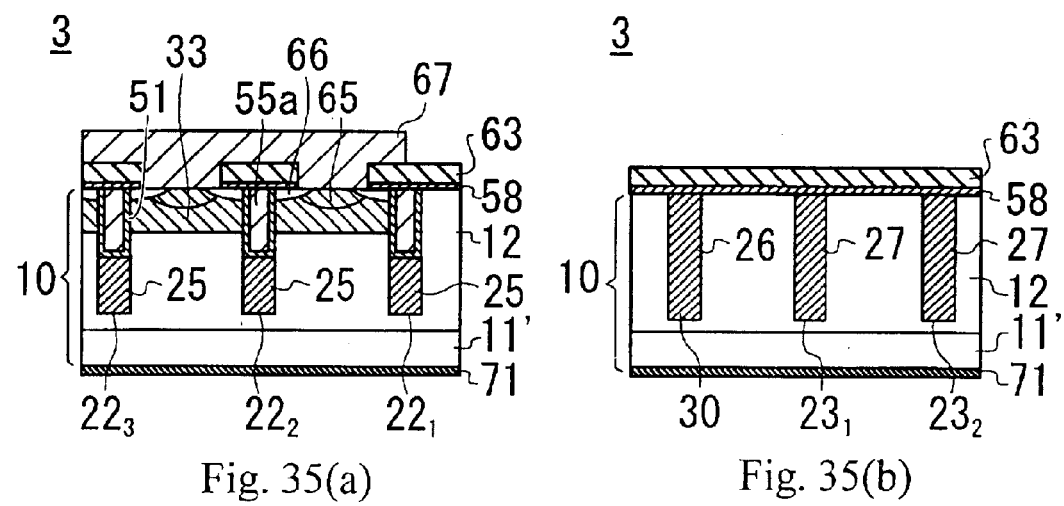
FIG. 35 is a view showing an example of a PN junction type IGBT among semiconductor devices according to the present invention.

A semiconductor device 3 shown in FIGS. 35(a) and 35(b) is a PN junction type IGBT according to the present invention. The semiconductor device 3 has the same structure as that of the semiconductor device 1 of the above-described first embodiment except that the low concentration layer 12 of the first conductivity type is formed on a collector layer 11' of the second conductivity type and that a PN junction is formed between the low concentration layer 12 and the collector layer 11'.

When this semiconductor device 3 is brought into a conductive state, the PN junction between the low concentration layer 12 and the collector layer 11' is forward biased to inject minority carriers from the collector layer 11' into the low concentration layer 12, thereby lowering a conductive resistance.

The reference numeral 71 in FIGS. 35(a) and 35(b) denotes a collector electrode film that forms an ohmic junction with the collector layer 11'.

Figure 36A:
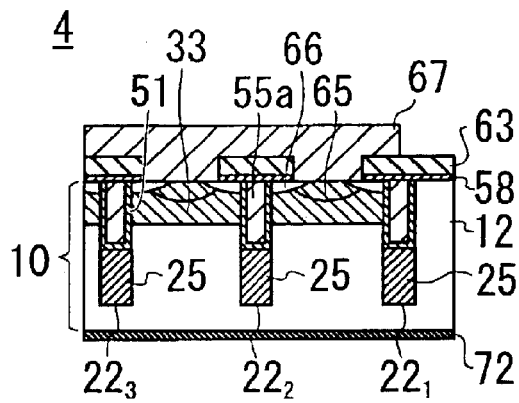
FIG. 36 is a view showing an example of a Schottky junction type IGBT among semiconductor devices according to the present invention.
Figure 36B:
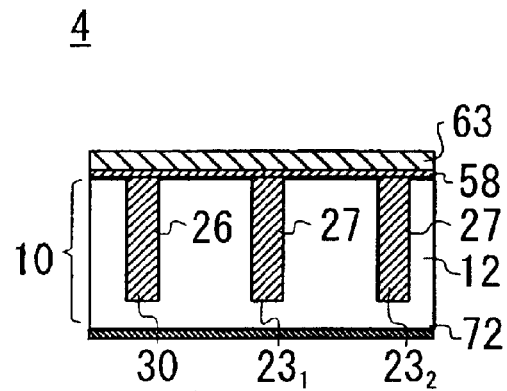
Figure 37:
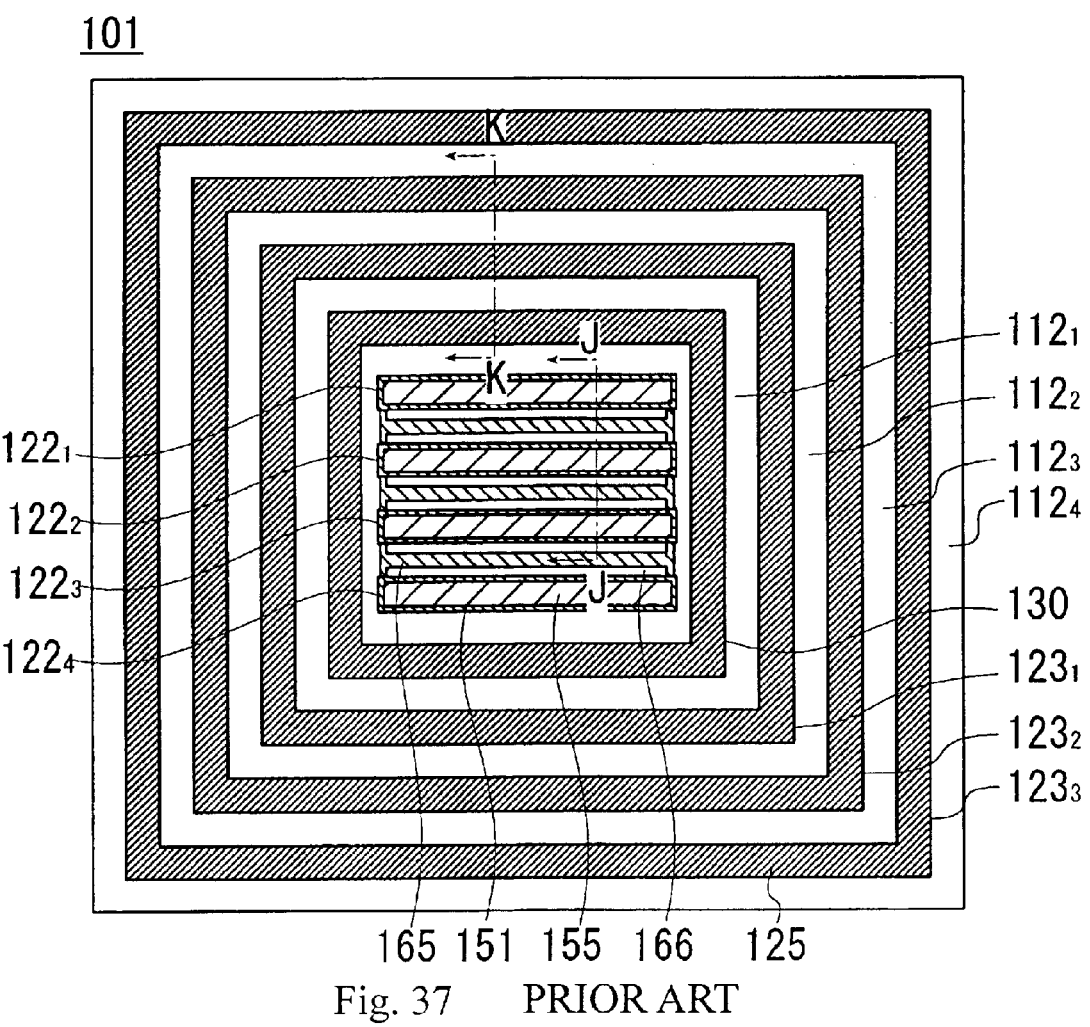
FIG. 37 is a plan view for illustrating a conventional semiconductor device.
Figure 38:
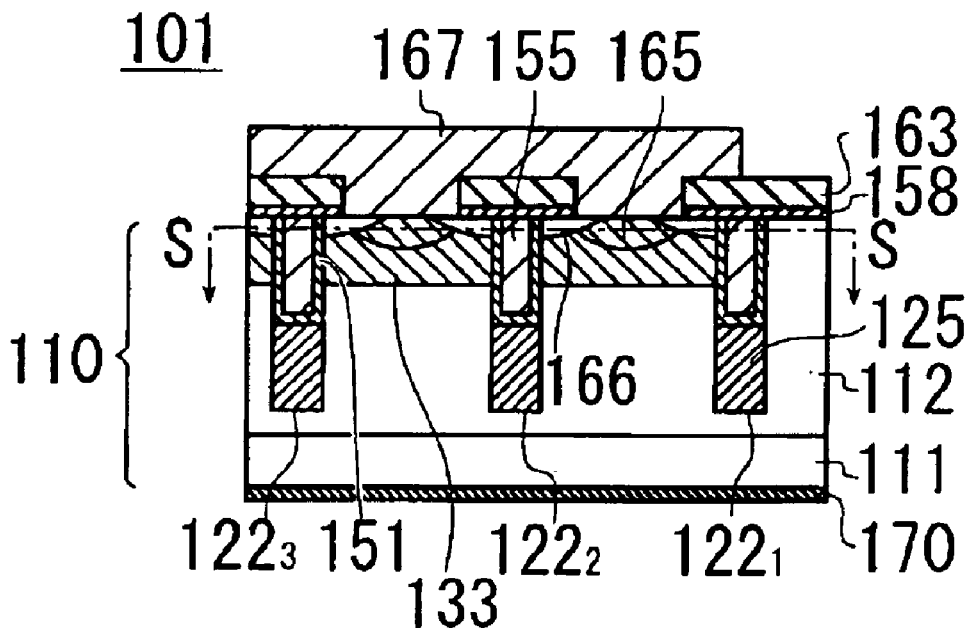
FIG. 38 is a sectional view taken along the line J—J in FIG. 37.
Figure 39:
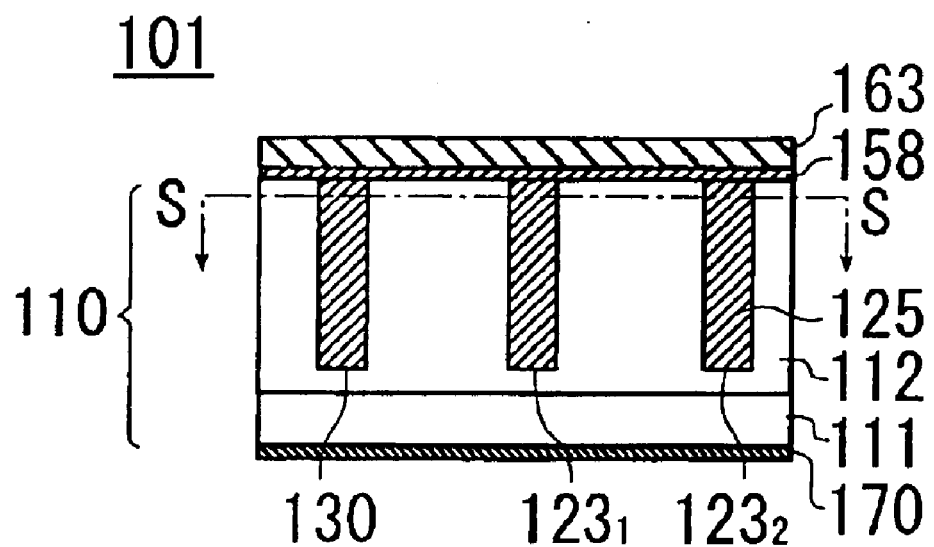
FIG. 39 is a sectional view taken along the line K—K in FIG. 37.

Next, a semiconductor device 4 shown in FIGS. 36(a) and 36(b) is a Schottky junction type IGBT according to the present invention.

In this semiconductor device 4, the back face of the substrate 10 is ground to expose the surface of the low concentration layer 12 of the first conductivity type. A Schottky electrode film 72 is formed on the exposed surface of the low concentration layer 12.

A part of the Schottky electrode film 72 being in contact with the low concentration layer 12 is made of chromium or the like. A Schottky junction is formed between the low concentration layer 12 and the Schottky electrode film 72.

The polarity of the Schottky junction is such that the Schottky junction is forward biased when the semiconductor device 4 is brought into a conductive state, that is, the base region 33 and the low concentration layer 12 are reverse biased. The Schottky junction is forward biased to inject minority carriers from the Schottky electrode film 72 into the low concentration layer 12 to lower a conductive resistance.

Figure 32:
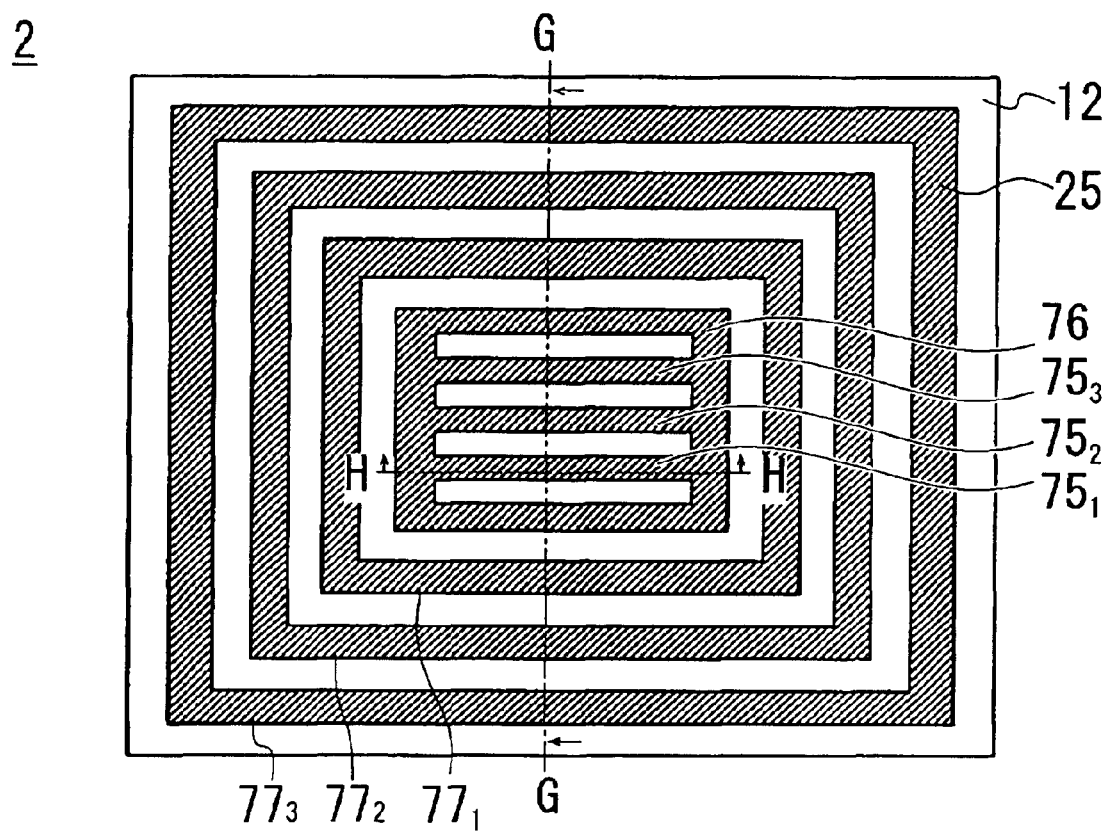
FIG. 32 is a plan view for illustrating a semiconductor device according to another embodiment of the present invention.
Figure 33:
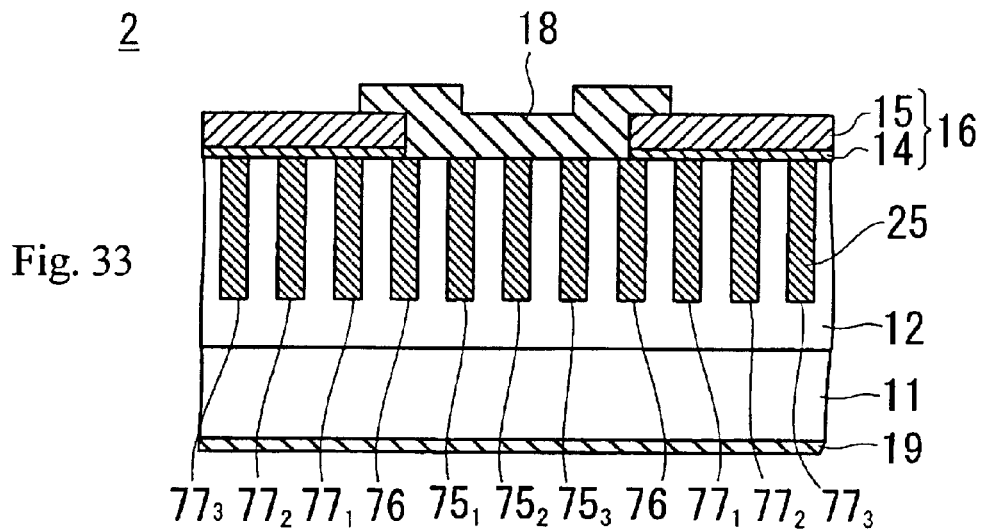
FIG. 33 is a sectional view taken along the line G—G in FIG. 32.
Figure 34:
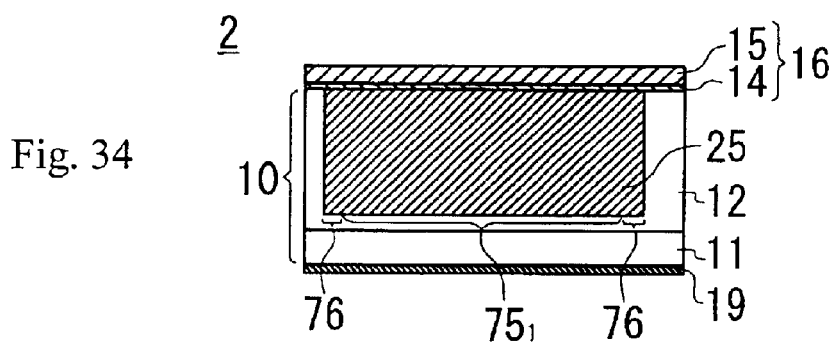
FIG. 34 is a sectional view taken along the line H—H in FIG. 32.

Next, the reference numeral 2 in FIGS. 32, 33 and FIG. 34 denotes a Schottky barrier diode type semiconductor device which constitutes another embodiment of the present invention.

Herein, FIG. 32 is a plan view of the semiconductor device 2 according to this embodiment, and FIGS. 33 and 34 are sectional views taken along the line G—G and a line H—H in FIG. 32, respectively. For simplification, a thermal oxide film, a PSG film, and an anode electrode, which will be described below, are omitted in FIG. 32.

The semiconductor device 2 includes the semiconductor layer 11 made of N-type silicon single crystal, and the N-type low concentration layer 12 formed by epitaxial growth of silicon single crystal on the surface of the semiconductor layer 11. A semiconductor layer with a surface of {100} plane orientation is used as the semiconductor layer 11. As a result, the surface of the low concentration layer 12 which is epitaxially grown on the surface of the semiconductor layer 11 also has {100} plane orientation.

In the low concentration layer 12, narrow linear active grooves $75_1$ to $75_3$, a quadrangular ring-shaped inner circumferential groove 76, and a plurality of quadrangular ring-shaped guard ring grooves $77_1$ to $77_3$ are formed to a depth shallower than a thickness of the low concentration layer 12. The inner circumferential groove 76 is in contact with both ends of the active grooves $75_1$ to $75_3$ so as to surround the active grooves $75_1$ to $75_3$. The guard ring grooves $77_1$ to $77_3$ concentrically surround the inner circumferential groove 76.

Similarly to the above-described semiconductor device 1, each of the inner circumferential groove 76 and the guard ring grooves $77_1$ to $77_3$ has rectangular shape in this semiconductor device 2. One side of each of the guard ring grooves $77_1$ to $77_3$ is parallel to one side of the inner circumferential groove 76. At the same time, a distance between the inner circumferential groove 76 and the guard ring groove $77_1$ at the innermost circumference and each of the distances between the guard ring grooves $77_1$ to $77_3$ are equal to each other. A depth of each of the grooves $75_1$ to $75_3$, 76, and $77_1$ to $77_3$ is shallower than a thickness of the low concentration layer 12. The low concentration layer 12 is exposed on the bottom face of each of the grooves $75_1$ to $75_3$, 76, and $77_1$ to $77_3$.

In formation of each of the grooves $75_1$ to $75_3$, 76, and $77_1$ to $77_3$, relative alignment is conducted with respect to the plane orientations of the semiconductor layer 11 and the low concentration layer 12 so that the {100} plane appears on the side faces of the narrow active grooves $75_1$ to $75_3$.

Since four sides of the quadrangular ring-shaped grooves (the inner circumferential groove 76 and the guard ring grooves $77_1$ to $77_3$) extend in a direction parallel to or perpendicular to the longitudinal direction of the active grooves $75_1$ to $75_3$, the {100} plane is exposed on the side faces of all the grooves $75_1$ to $75_3$, 76, and $77_1$ to $77_3$ same as on their bottom faces.

Each of the grooves $75_1$ to $75_3$, 76, and $77_1$ to $77_3$ is filled with the semiconductor filler 25 made of P-type silicon single crystal formed by epitaxial growth. PN junctions are formed between the semiconductor fillers 25 in the respective grooves $75_1$ to $75_3$, 76, and $77_1$ to $77_3$ and the low concentration layer 12.

An insulating film 16 comprising a thermal oxide film 14 and a PSG film 15 is provided outside the vicinity of the outer circumferential edge on the inner circumferential groove 76. A part which is not covered with the insulating film 16, that is, inside the vicinity of the outer circumferential edge on the inner circumferential groove 76, an anode electrode 18 made of a metal thin film is provided.

Each of the grooves $75_1$ to $75_3$, 76, and $77_1$ to $77_3$ is filled with the semiconductor filler 25 to the same height as the height of a surface of the low concentration layer 12. In the part inside the outer circumference of the inner circumferential groove 76 where the insulating film 16 is not provided, the anode electrode 18 is in contact with the surface of the low concentration layer 12, the surface of the semiconductor filler 25 in the inner circumferential groove 76, and the surfaces of the semiconductor fillers 25 in the active grooves $75_1$ to $75_3$. Therefore, among the inner circumferential groove 76 and the guard ring grooves $77_1$ to $77_3$ that are concentrically provided, the grooves other than the inner circumferential groove 76, that is, the guard ring grooves $77_1$ to $77_3$ are not in contact with the anode electrode 18. As a result, the semiconductor filler 25 in each of the guard ring grooves $77_1$ to $77_3$ is at a floating potential.

The metal constituting the anode electrode 18 is a material forming a Schottky junction at its portion being in contact with the low concentration layer 12, and the anode electrode functions as a Schottky electrode. On the other hand, since the impurity of second conductivity type at a high concentration is added to the semiconductor fillers 25 in each of the grooves $75_1$ to $75_3$, 76, and $77_1$ to $77_3$ when the semiconductor filler 25 is formed, or impurity of second conductivity type is diffused at a high concentration to the semiconductor fillers 25 after forming, an ohmic junctions are formed between the anode electrode 18 and the semiconductor fillers 25.

A cathode electrode 19 forming an ohmic junction with the semiconductor layer 11 is formed on the surface of the semiconductor layer 11. When a positive voltage is applied to the anode electrode 18 while a negative voltage is applied to the cathode electrode 19, the Schottky junction between the low concentration layer 12 and the anode electrode 18 is forward biased to allow a current to flow from the anode electrode 18 toward the cathode electrode 19.

At this moment, the PN junctions between the semiconductor fillers 25 in the active grooves $75_1$ to $75_3$ and in the inner circumferential groove 76 connected to each of the active grooves $75_1$ to $75_3$ and the low concentration layer 12 are also forward biased. However, since the PN junctions are clamped due to forward voltage drop across the Schottky junction, thereby keeping a current from flowing.

On the contrary, when a negative voltage is applied to the anode electrode 18 while a positive voltage is applied to the cathode electrode 19, the Schottky junction and the PN junctions, which have been forward biased with the above-described voltages, are reverse biased.

In this state, the depletion layer is expanded into the low concentration layer 12 from the reverse biased Schottky junction and the reverse biased PN junctions to reach the semiconductor fillers 25 in the guard ring grooves $77_1$ to $77_3$ at a floating potential. As a result, the potential of the semiconductor fillers 25 is stabilized, so that the depletion layer is further expanded from the semiconductor fillers 25.

When a voltage higher than the previously applied voltage is applied in this state, the depletion layer is further expanded below the active grooves $75_1$ to $75_3$, the inner circumferential groove 76, and the guard ring grooves $77_1$ to $77_3$.

Also in this semiconductor device 2, the {100} plane of the low concentration layer 12 is exposed in the grooves $75_1$ to $75_3$, 76, and $77_1$ to $77_3$. Since the semiconductor fillers 25 are grown from the {100} plane to fill each of the grooves $75_1$ to $75_3$, 76, and $77_1$ to $77_3$, the grooves $75_1$ to $75_3$, 76, and $77_1$ to $77_3$ are filled with the semiconductor fillers 25 which are grown to a uniform height.

According to the present invention, a semiconductor device having grooves uniformly filled with semiconductor fillers is obtained.

What is claimed is:

1. A semiconductor device comprising:

a semiconductor substrate including a low concentration layer of a first conductivity type, the semiconductor substrate having grooves formed on its surface on the low concentration layer side, wherein the grooves include a plurality of narrow active grooves and a ring-shaped inner circumferential groove surrounding the active grooves, bottom faces of the active grooves and a bottom face of the inner circumferential groove are provided in the low concentration layer, and both ends of each of the active grooves are directly connected to the inner circumferential groove.

2. The semiconductor device according to claim 1, wherein a semiconductor filler of a second conductivity type is provided in each of the active grooves and the inner circumferential groove, and the semiconductor filler in each of the active grooves is connected to the semiconductor filler in the inner circumferential groove.

3. The semiconductor device according to claim 2 further comprising:

the semiconductor substrate including gate grooves, each being formed by removing an upper portion of the semiconductor filler in each of the active grooves, remaining portions corresponding lower portions of the semiconductor fillers, situated at lower portions of the gate grooves;

a gate insulating film provided at least on a side face of each of the gate grooves;

gate electrode plugs provided in contact with the gate insulating film in the gate grooves, being insulated from the remaining portions of the semiconductor fillers;

a base region of a second conductivity type provided on a surface side inside the low concentration layer at a position in contact with the gate insulating film; and a source region of a first conductivity type provided at a position on a surface side inside the base region so as to be separated from the low concentration layer and to be in contact with the gate insulating film, wherein, when a voltage is applied to the gate electrode plugs to form an inversion layer of the first conductivity type in a portion of the base region in contact with the gate insulating film, the source region and the low concentration layer are connected to each other through the inversion layer.

4. The semiconductor device according to claim 3, wherein a height of the semiconductor filler provided in the inner circumferential groove is higher than that of the remaining portions of the semiconductor fillers in the active grooves.

5. The semiconductor device according to claim 3, wherein the semiconductor substrate includes a drain layer of the first conductivity type, having a higher concentration than the low concentration layer, and a drain electrode film forming an ohmic junction with the drain layer is provided on the drain layer.

6. The semiconductor device according to claim 3, wherein the semiconductor substrate includes a collector layer of the second conductivity type, forming a PN junction with the low concentration layer, and a collector electrode film forming an ohmic junction with the collector layer is formed on the collector layer.

7. The semiconductor device according to claim 3, wherein a Schottky electrode film forming a Schottky junction with the low concentration layer is provided on a surface of the low concentration layer.

8. The semiconductor device according to claim 2, wherein a Schottky electrode forming ohmic junctions with the semiconductor fillers and a Schottky junction with the low concentration layer is provided on surfaces of the semiconductor fillers provided in the active grooves and on surfaces of parts of the low concentration layer situated between the active grooves, in a region surrounded by the inner circumferential groove.

9. The semiconductor device according to claim 1, wherein the semiconductor substrate further has a plurality of ring-shaped guard ring grooves concentrically surrounding the inner circumferential groove.

10. The semiconductor device according to claim 9, wherein the semiconductor filler is provided in each of the guard ring grooves.

11. The semiconductor device according to claim 1, wherein the low concentration layer has a surface of a plane orientation of {100}, the inner circumferential groove is formed in a quadrangular ring shape, each of the active grooves is provided in a parallel direction to two parallel sides among four sides of the inner circumferential groove, and the {100} plane of crystal of the semiconductor substrate is exposed on a side face and a bottom face inside each of the active grooves and on a side face and a bottom face inside the inner circumferential groove.

12. A semiconductor device comprising:

a semiconductor substrate including a low concentration layer of a first conductivity type, the semiconductor substrate having grooves formed on its surface on the low concentration layer side, wherein the grooves include a plurality of narrow active grooves and a ring-shaped inner circumferential groove surrounding the active grooves, bottom faces of the active grooves and a bottom face of the inner circumferential groove are provided in the low concentration layer, and both ends of each of the active grooves are connected to the inner circumferential groove, wherein a semiconductor filler of a second conductivity type is provided in each of the active grooves and the inner circumferential groove, wherein the semiconductor filler in each of the active grooves is connected to the semiconductor filler in the inner circumferential groove, wherein a Schottky electrode forming ohmic junctions with the semiconductor fillers and a Schottky junction with the low concentration layer is provided on surfaces of the semiconductor fillers provided in the active grooves and on surfaces of parts of the low concentration layer situated between the active grooves, in a region surrounded by the inner circumferential groove.

* * * * *